United States Patent
Liaw

(10) Patent No.: US 12,363,949 B2
(45) Date of Patent: Jul. 15, 2025

(54) GATE-ALL-AROUND DEVICES WITH OPTIMIZED GATE SPACERS AND GATE END DIELECTRIC

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 249 days.

(21) Appl. No.: 17/874,022

(22) Filed: Jul. 26, 2022

(65) Prior Publication Data

US 2022/0367659 A1    Nov. 17, 2022

Related U.S. Application Data

(62) Division of application No. 16/899,321, filed on Jun. 11, 2020, now Pat. No. 11,581,414.

(Continued)

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/024* (2025.01); *H10D 30/62* (2025.01);
(Continued)

(58) Field of Classification Search
CPC ..... H01L 21/823431; H01L 21/823481; H01L 21/823878; H01L 21/42392;
(Continued)

(56) References Cited

U.S. PATENT DOCUMENTS 7,026,689 B2    3/2006 Liaw
7,419,898 B2    9/2008 Liaw
(Continued)

FOREIGN PATENT DOCUMENTS

CN    108695377 A    10/2018
CN    109427672 A     3/2019
(Continued)

*Primary Examiner* — Tuan A Hoang
(74) *Attorney, Agent, or Firm* — HAYNES AND BOONE, LLP

(57) ABSTRACT

A method includes providing a substrate, an isolation structure, a semiconductor fin having a stack of first and second semiconductor layers, a dummy gate, and outer spacers on opposing sidewalls of the dummy gate; etching the semiconductor fin to form source/drain (S/D) trenches; etching the second semiconductor layers from the S/D trenches to form gaps vertically between the first semiconductor layers; forming inner spacers in the gaps; epitaxially growing S/D features in the S/D trenches; forming an inter-layer dielectric layer over the S/D features; etching the dummy gate and the outer spacers to form a gate-end trench away from the semiconductor fin and over the isolation structure; and forming a gate-end dielectric feature filling the gate-end trench, wherein a dielectric constant of the gate-end dielectric feature is higher than both a dielectric constant of the outer spacers and a dielectric constant of the inner spacers.

20 Claims, 33 Drawing Sheets

Related U.S. Application Data

(60) Provisional application No. 63/002,186, filed on Mar. 30, 2020.

(51) Int. Cl.
  *H10D 30/62* (2025.01)
  *H10D 84/01* (2025.01)
  *H10D 84/03* (2025.01)

(52) U.S. Cl.
  CPC ..... *H10D 84/0133* (2025.01); *H10D 84/0158* (2025.01); *H10D 84/038* (2025.01); *H10D 30/6219* (2025.01)

(58) Field of Classification Search
  CPC ............ H01L 29/66795; H01L 29/785; H10D 30/6735; H10D 30/014; H10D 30/024; H10D 30/43; H10D 30/62; H10D 62/121; H10D 62/115; H10D 84/0151
  See application file for complete search history.

(56) References Cited

U.S. PATENT DOCUMENTS

| | | | |
|---|---|---|---|
| 9,613,953 | B2 | 4/2017 | Liaw |
| 9,793,273 | B2 | 10/2017 | Liaw |
| 9,805,985 | B2 | 10/2017 | Liaw |
| 10,665,669 | B1 | 5/2020 | Xie |
| 2017/0133632 | A1* | 5/2017 | Yang ............... H10K 50/85 |
| 2019/0067120 | A1* | 2/2019 | Ching ............... H10D 30/611 |
| 2019/0067417 | A1 | 2/2019 | Ching |
| 2019/0067418 | A1* | 2/2019 | Yang ............... H01L 21/3065 |
| 2019/0131431 | A1 | 5/2019 | Cheng et al. |
| 2019/0326287 | A1 | 10/2019 | Liaw |
| 2020/0044060 | A1 | 2/2020 | Cheng et al. |
| 2020/0066725 | A1 | 2/2020 | Bhuwalka et al. |
| 2020/0075331 | A1 | 3/2020 | Noh et al. |
| 2020/0075716 | A1 | 3/2020 | Wang |
| 2020/0091143 | A1* | 3/2020 | Zang ............... H10D 84/014 |
| 2020/0091145 | A1 | 3/2020 | Guha et al. |
| 2020/0098878 | A1 | 3/2020 | Guler et al. |
| 2020/0135848 | A1* | 4/2020 | Lim ............... H10D 84/0167 |
| 2020/0357896 | A1* | 11/2020 | Cheng ............ H01L 21/823431 |

FOREIGN PATENT DOCUMENTS

| | | |
|---|---|---|
| CN | 109427776 A | 3/2019 |
| CN | 10890363 A | 3/2020 |
| CN | 110911404 A | 3/2020 |
| KR | 20180018426 A | 2/2018 |
| KR | 20180113118 A | 10/2018 |
| KR | 20180123422 A | 11/2018 |
| KR | 20190024535 A | 3/2019 |
| KR | 20200014235 A | 2/2020 |
| KR | 20200025538 A | 3/2020 |
| KR | 20200023960 A | 6/2020 |
| TW | 202008561 A | 2/2020 |

* cited by examiner

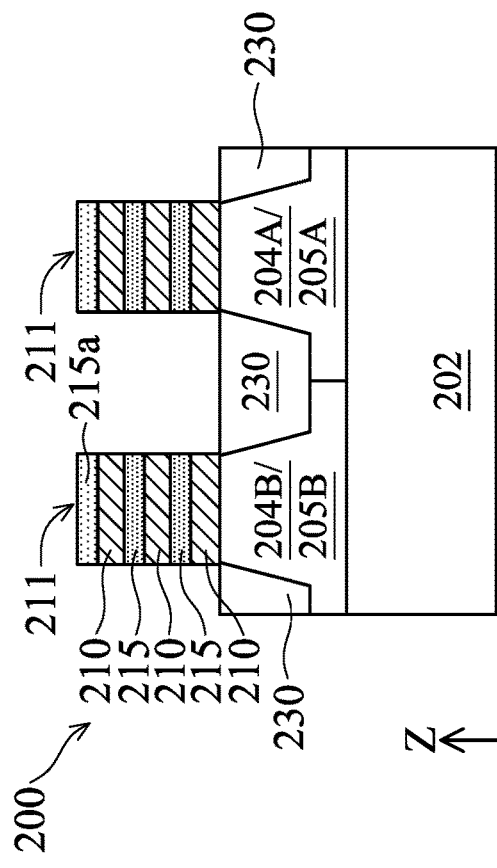
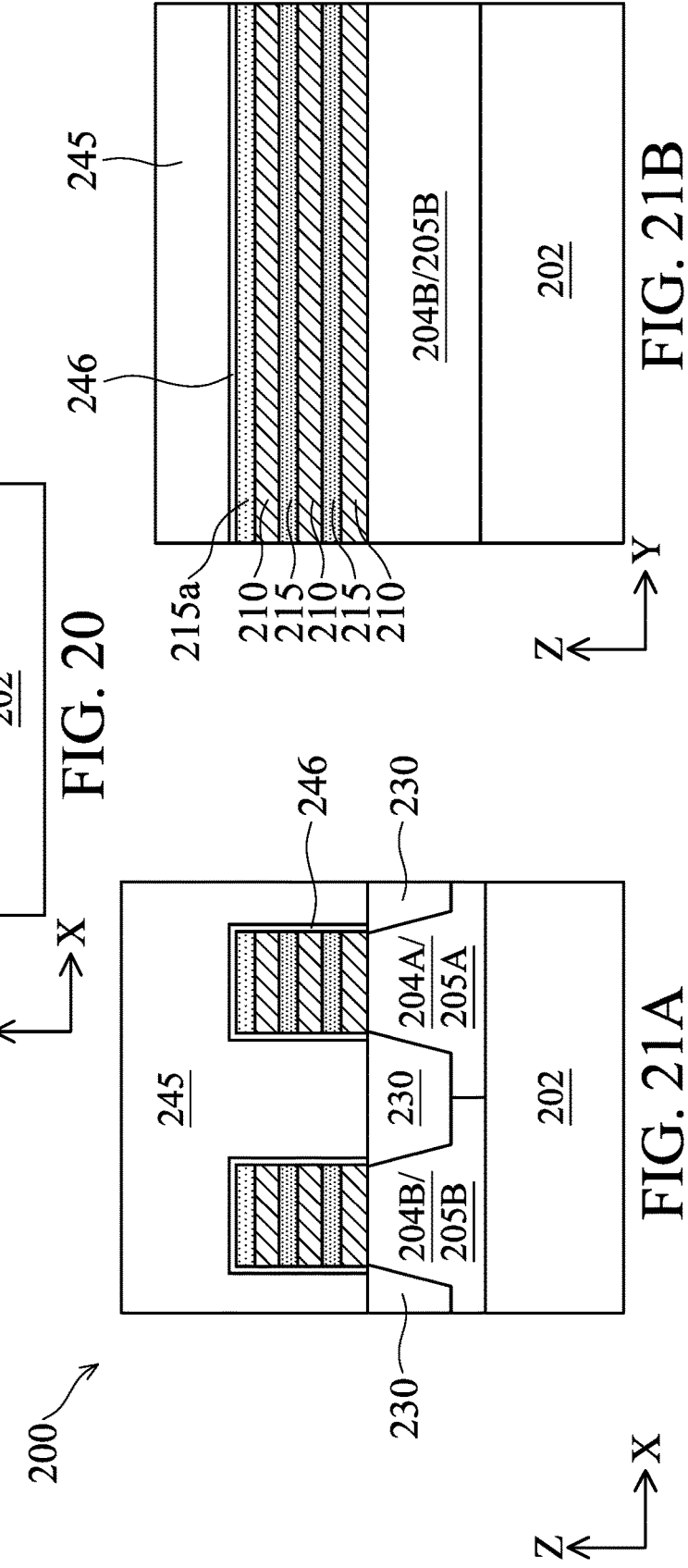
FIG. 20
FIG. 21A
FIG. 21B

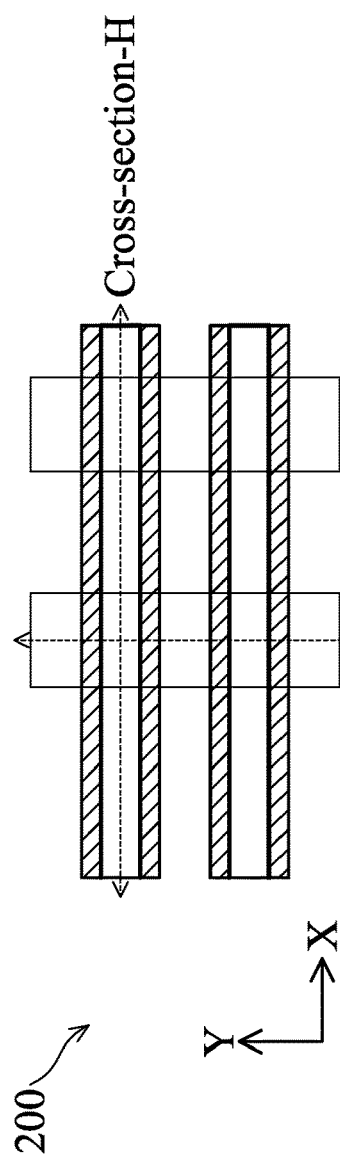
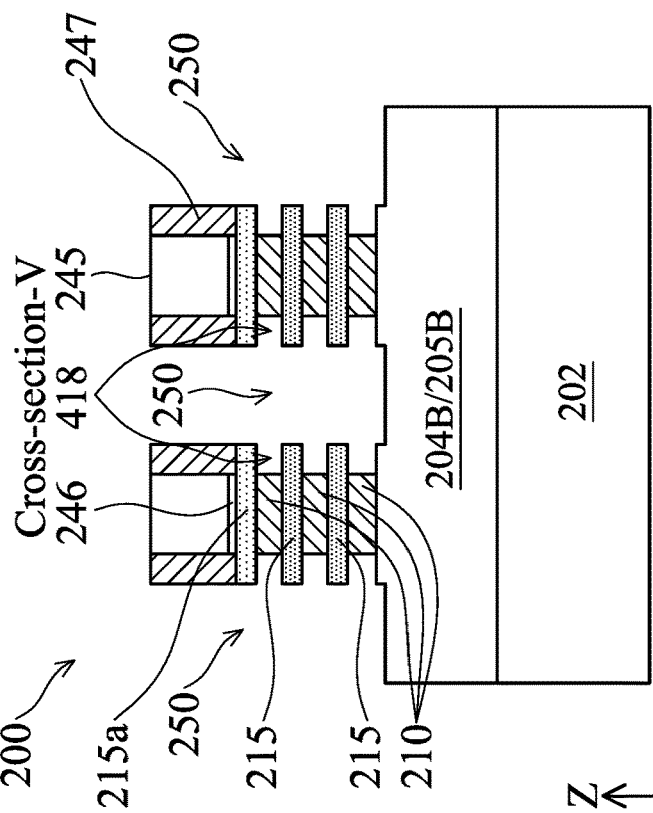
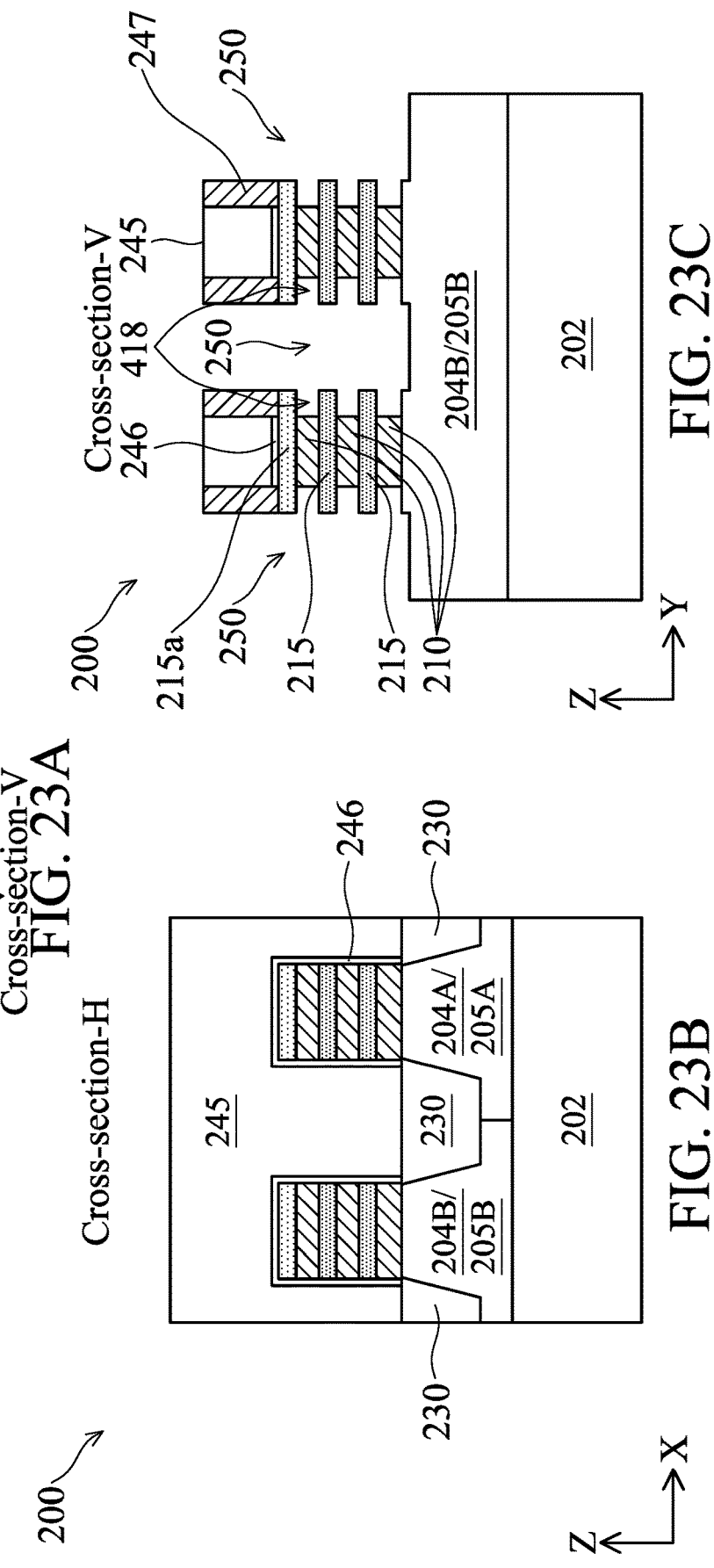
FIG. 23A
FIG. 23B
FIG. 23C

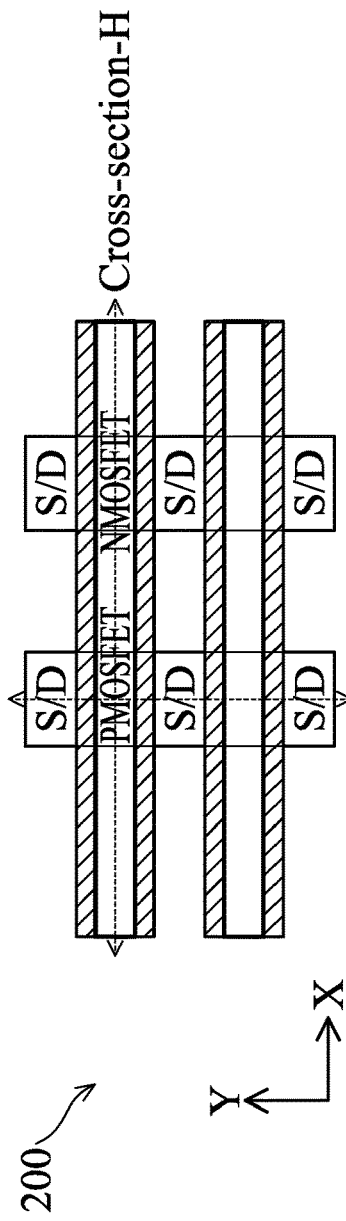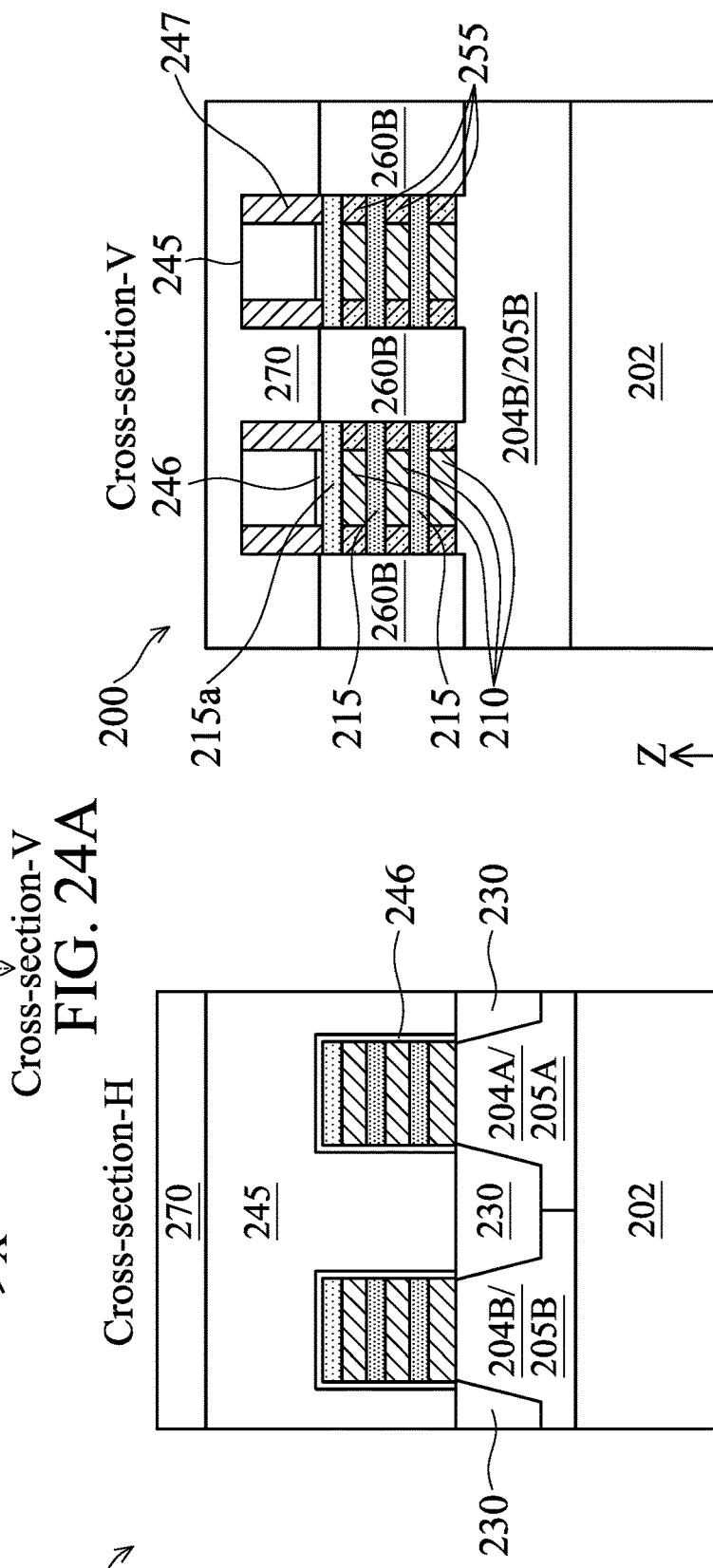

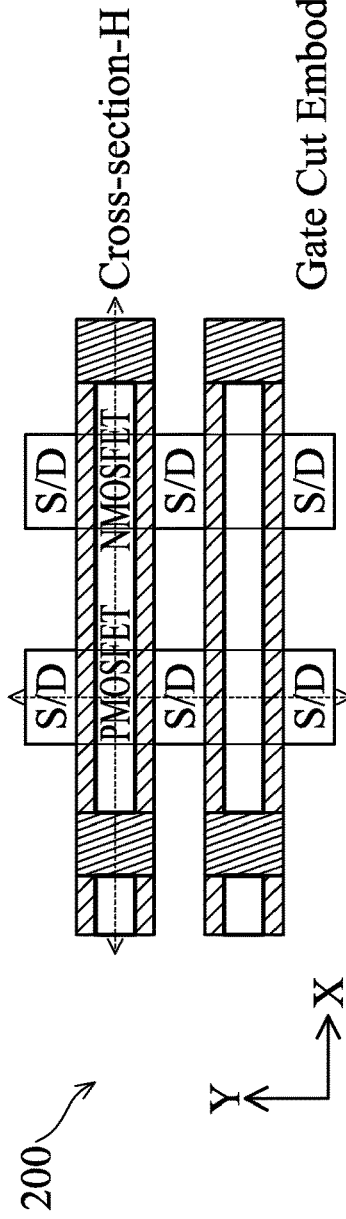
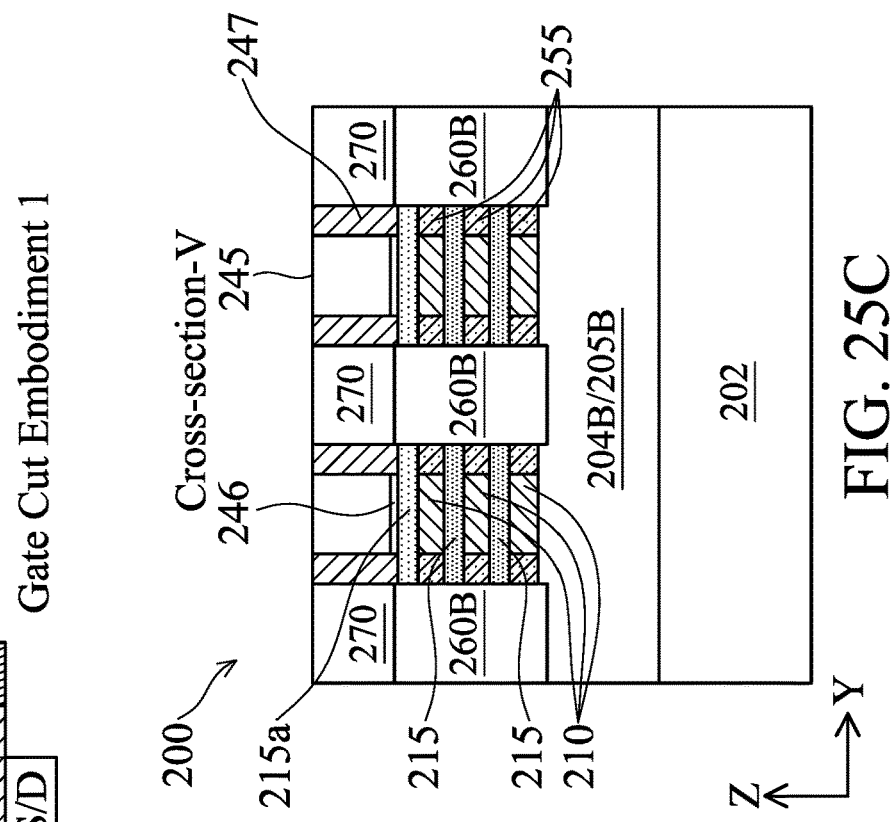
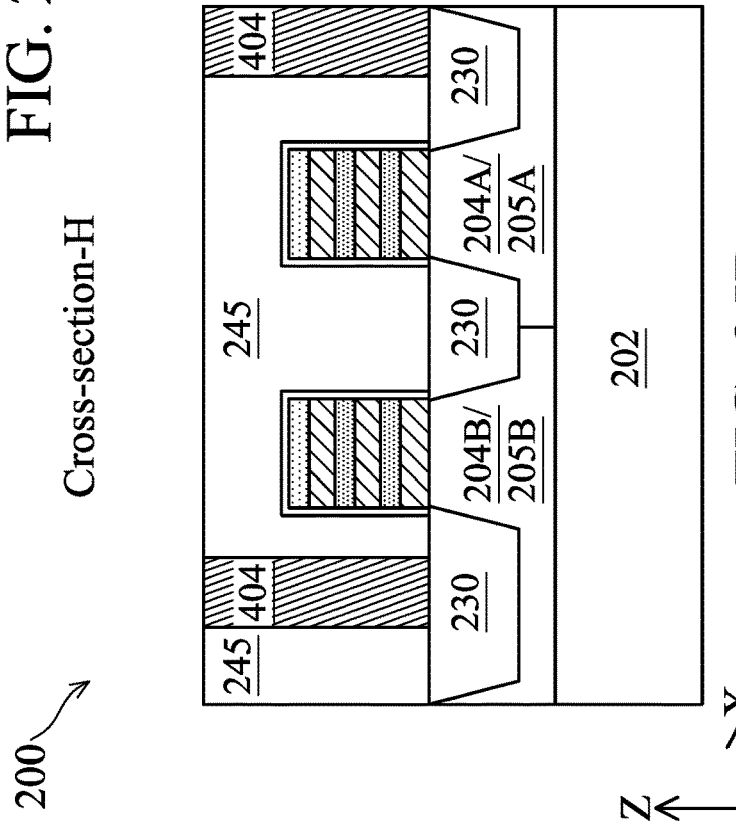
FIG. 25A
FIG. 25B
FIG. 25C

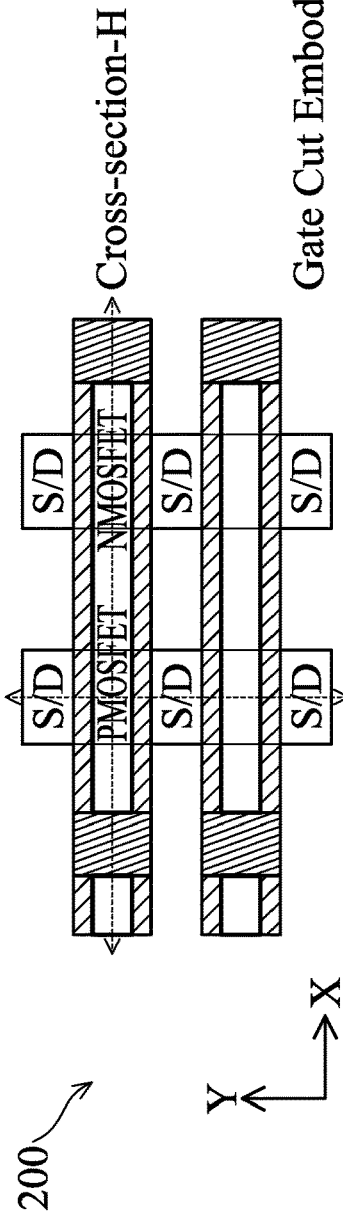
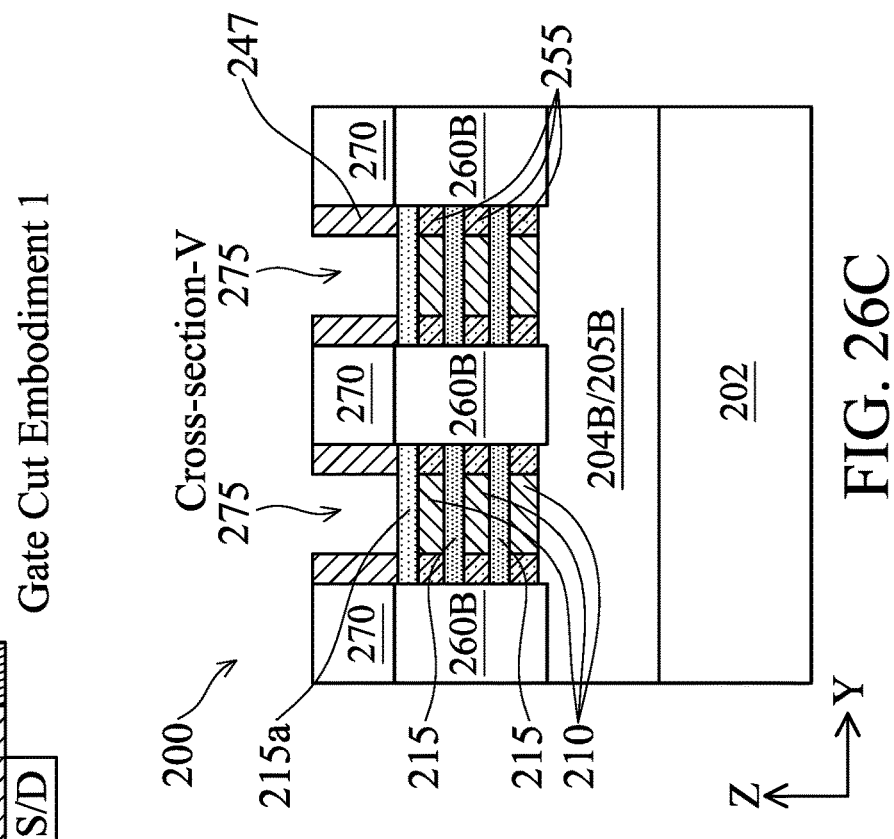
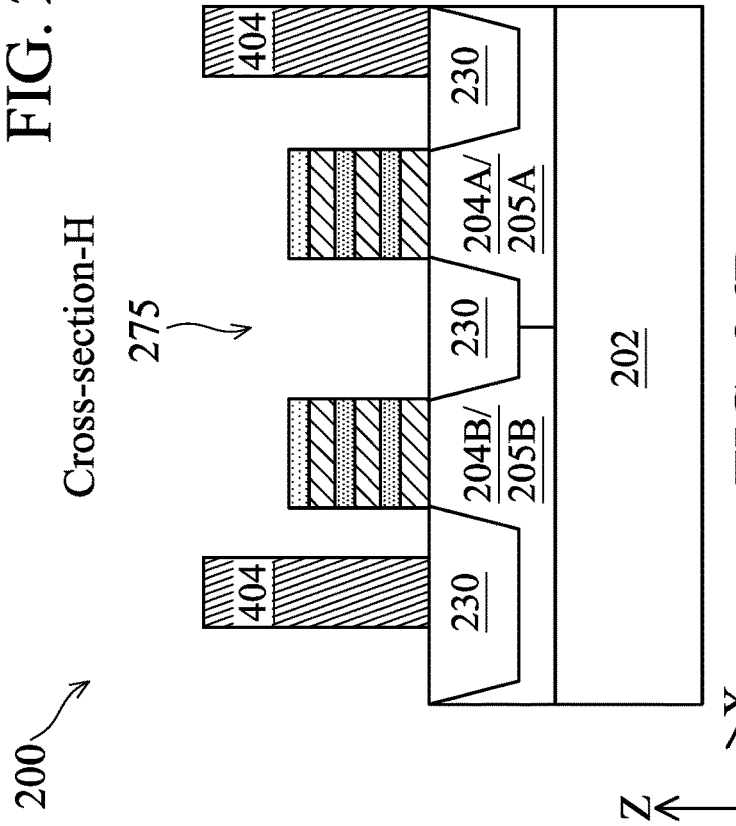
FIG. 26A
FIG. 26B
FIG. 26C

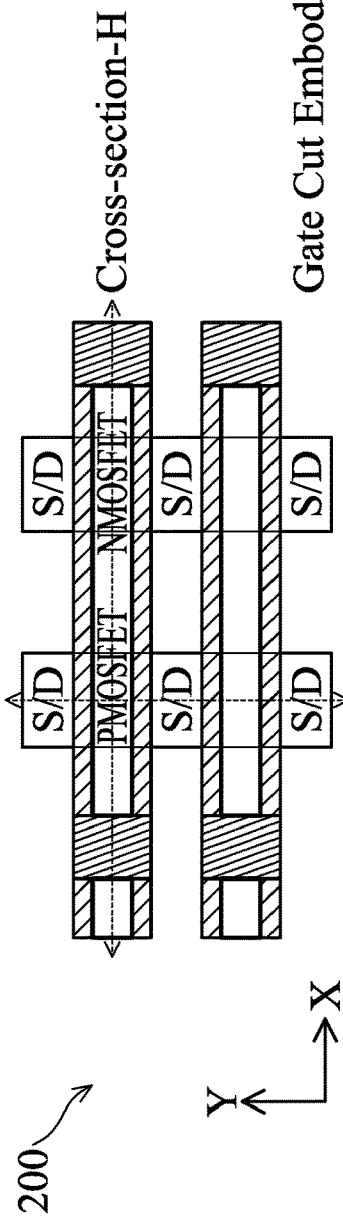
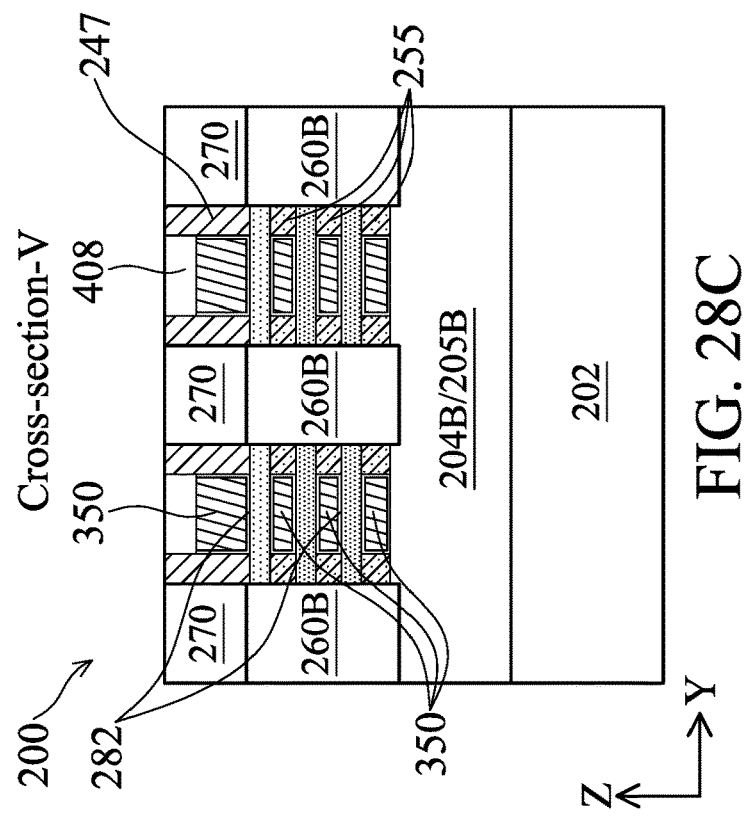
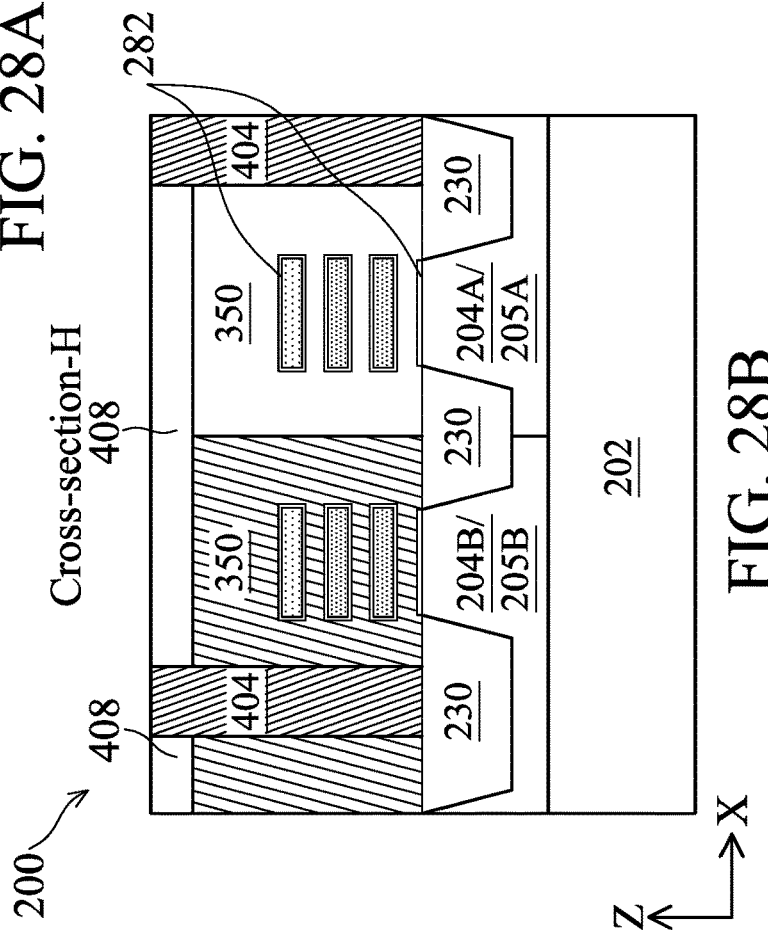
FIG. 28A
FIG. 28C
FIG. 28B

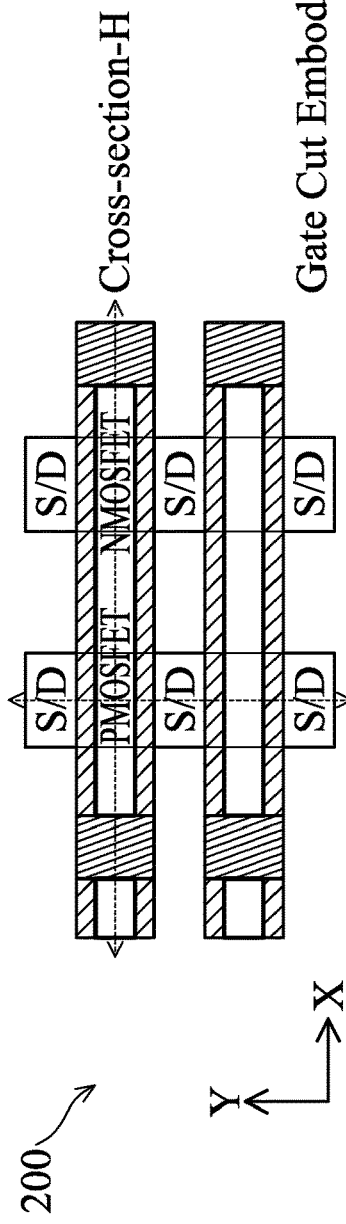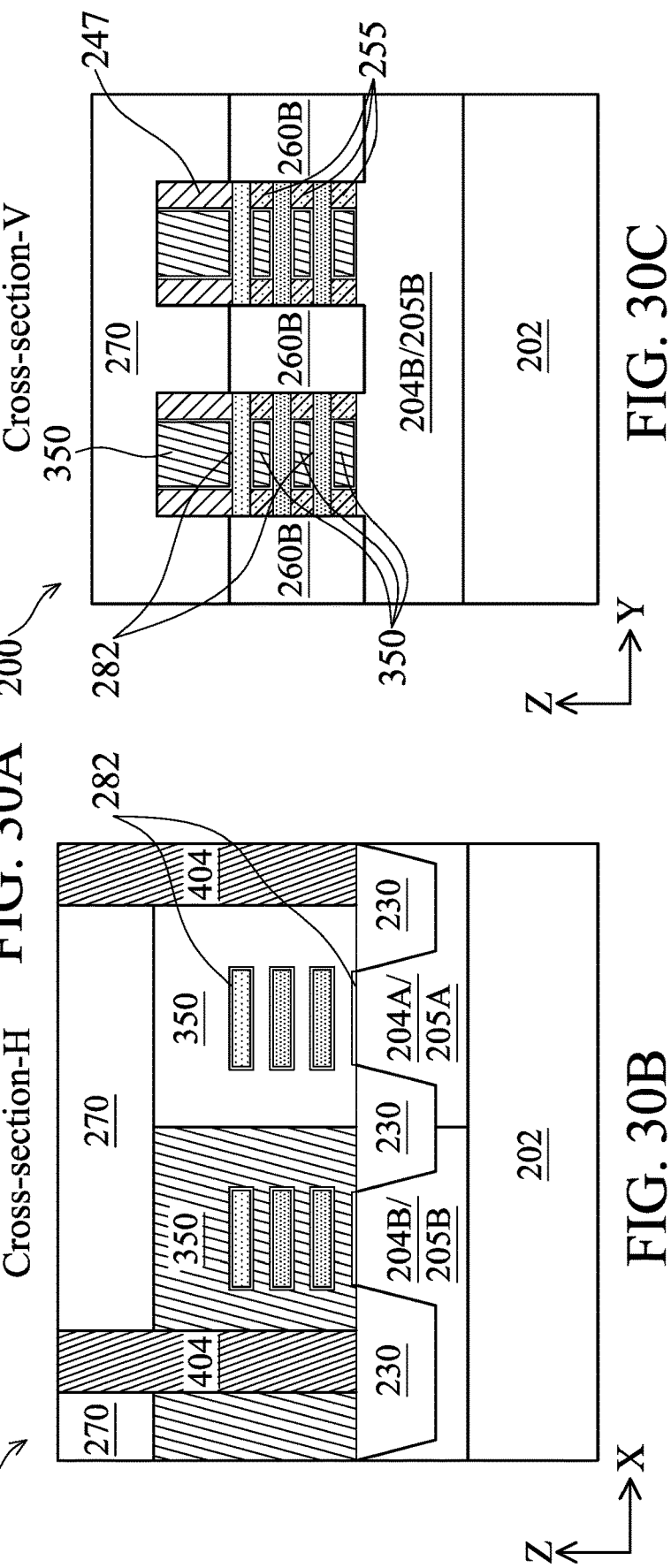
FIG. 30A
FIG. 30B
FIG. 30C

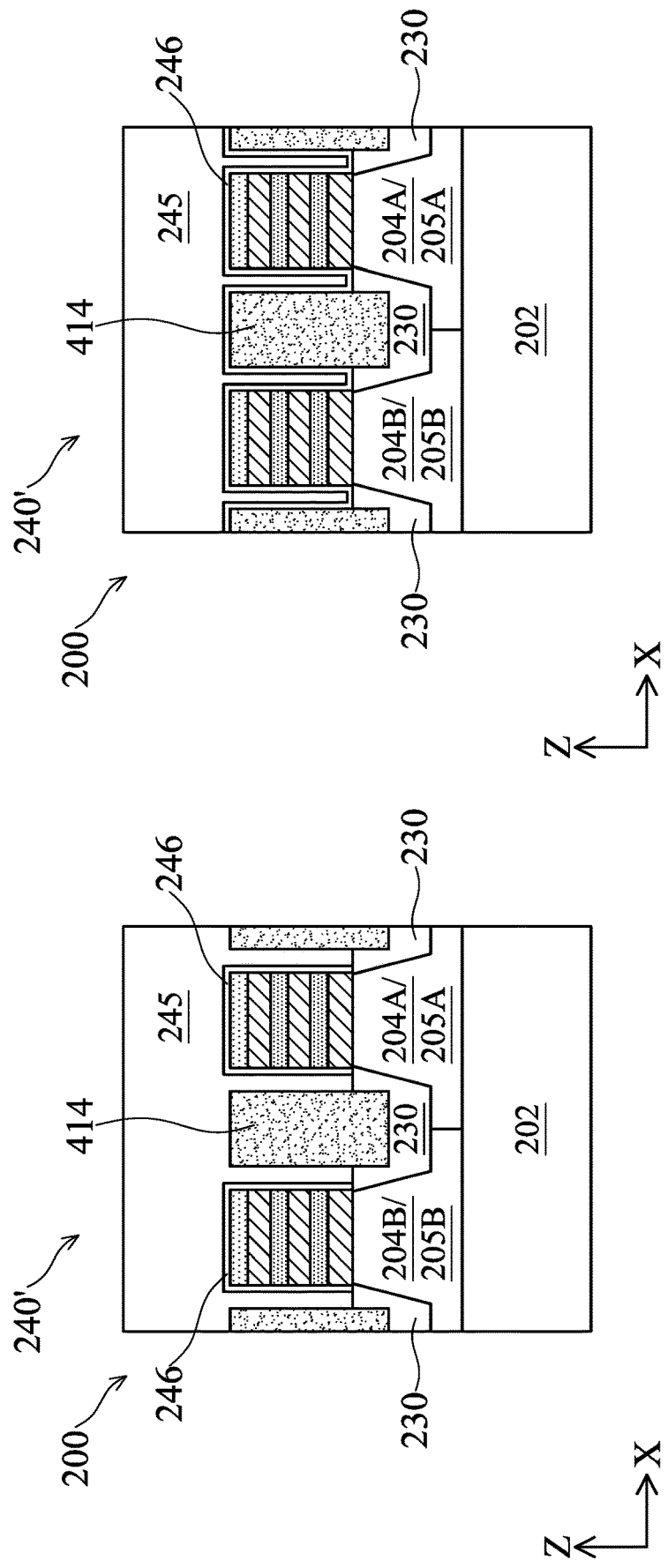

GATE-ALL-AROUND DEVICES WITH OPTIMIZED GATE SPACERS AND GATE END DIELECTRIC

PRIORITY

This is a divisional of U.S. application Ser. No. 16/899,321 filed Jun. 11, 2020, which claims benefits to the U.S. Provisional Application Ser. No. 63/002,186 filed Mar. 30, 2020, herein incorporated by reference in their entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multi-gate devices have been introduced to improve gate control. Multi-gate devices have been observed to increase gate-channel coupling, reduce OFF-state current, and/or reduce short-channel effects (SCEs). One such multi-gate device is the gate-all around (GAA) device, which includes a gate structure that extends around a channel region to provide access to the channel region on multiple sides. GAA devices enable aggressive scaling down of IC technologies, maintaining gate control and mitigating SCEs, while seamlessly integrating with conventional IC manufacturing processes. As GAA devices continue to scale, challenges have arisen when fabricating a GAA device. Such challenges include short circuits between source/drain contact and gates and between adjacent gate ends due to insufficient gate isolation, long-term reliability issues associated with metal diffusion from metal gates and source/drain contacts, increased stray capacitance between gates and source/drain, among others. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 18, 19, 20, 21A, 21B, 22B, 22C, 23B, 23C, 24B, 24C, 25B, 25C, 26B, 26C, 27B, 27C, 28B, 28C, 29B, 29C, 30B, 30C are fragmentary diagrammatic cross-sectional views of a GAA device, in portion, at various fabrication stages (such as those associated with the method in FIGS. 17A-17C) according to various aspects of the present disclosure.

FIGS. 22A, 23A, 24A, 25A, 26A, 27A, 28A, 29A, and 30A are fragmentary diagrammatic top views of a GAA device, in portion, at various fabrication stages (such as those associated with the method in FIGS. 17A-17C) according to various aspects of the present disclosure.

FIGS. 32A, 32B, 32C, 32D, 32E, and 32E-1 are fragmentary diagrammatic cross-sectional views of a GAA device, in portion, at various fabrication stages (such as those associated with the method in FIG. 31) according to various aspects of the present disclosure.

DETAILED DESCRIPTION

Figure 1:
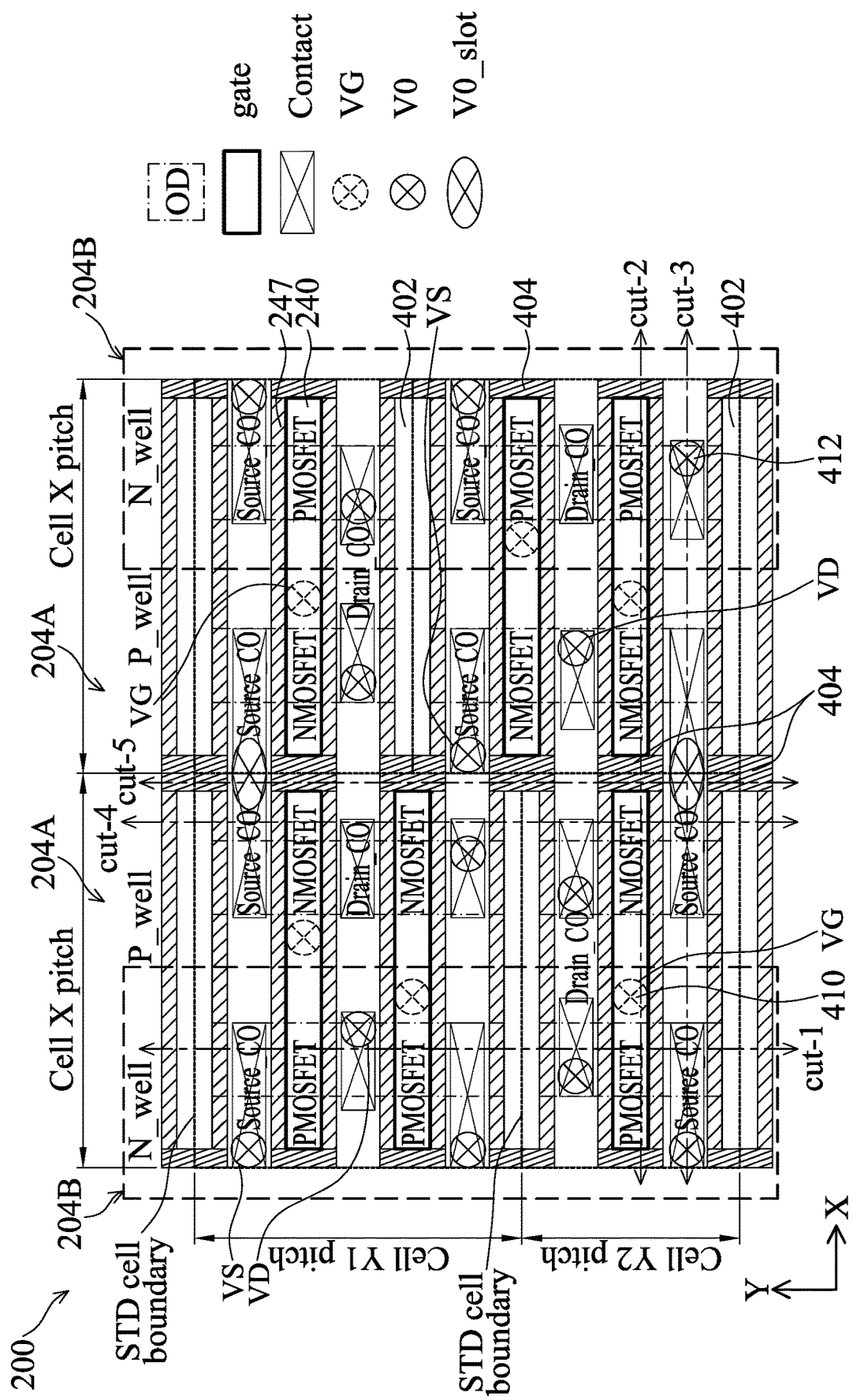
FIG. 1 is a top view of a layout of a GAA device, in portion, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application relates to a semiconductor fabrication process and the structure thereof, and more particularly to gate-all-around (GAA) devices such as vertically-stacked gate-all-around horizontal nanowire or nanosheet MOSFET devices with extremely narrow cylindrical or sheet channel body. GAA devices are promising to take CMOS to the next stage of the roadmap due to good gate control ability, lower leakage current, shrink capability, and fully FinFET device layout compatibility. The general purposes of the present disclosure include providing new gate spacer designs combined with dielectric fins (or dielectric lines) for self-aligned contact scheme. This advantageously reduces the risks of short circuits as device density continues to rise. As for gate sidewall dielectric, the present disclosure provides a highly reliable gate end dielectric scheme between the gate-end and gate-end as well as multiple spacer scheme for gate sidewalls to reduce stray capacitance and to increase gate isolation.

Figure 4:
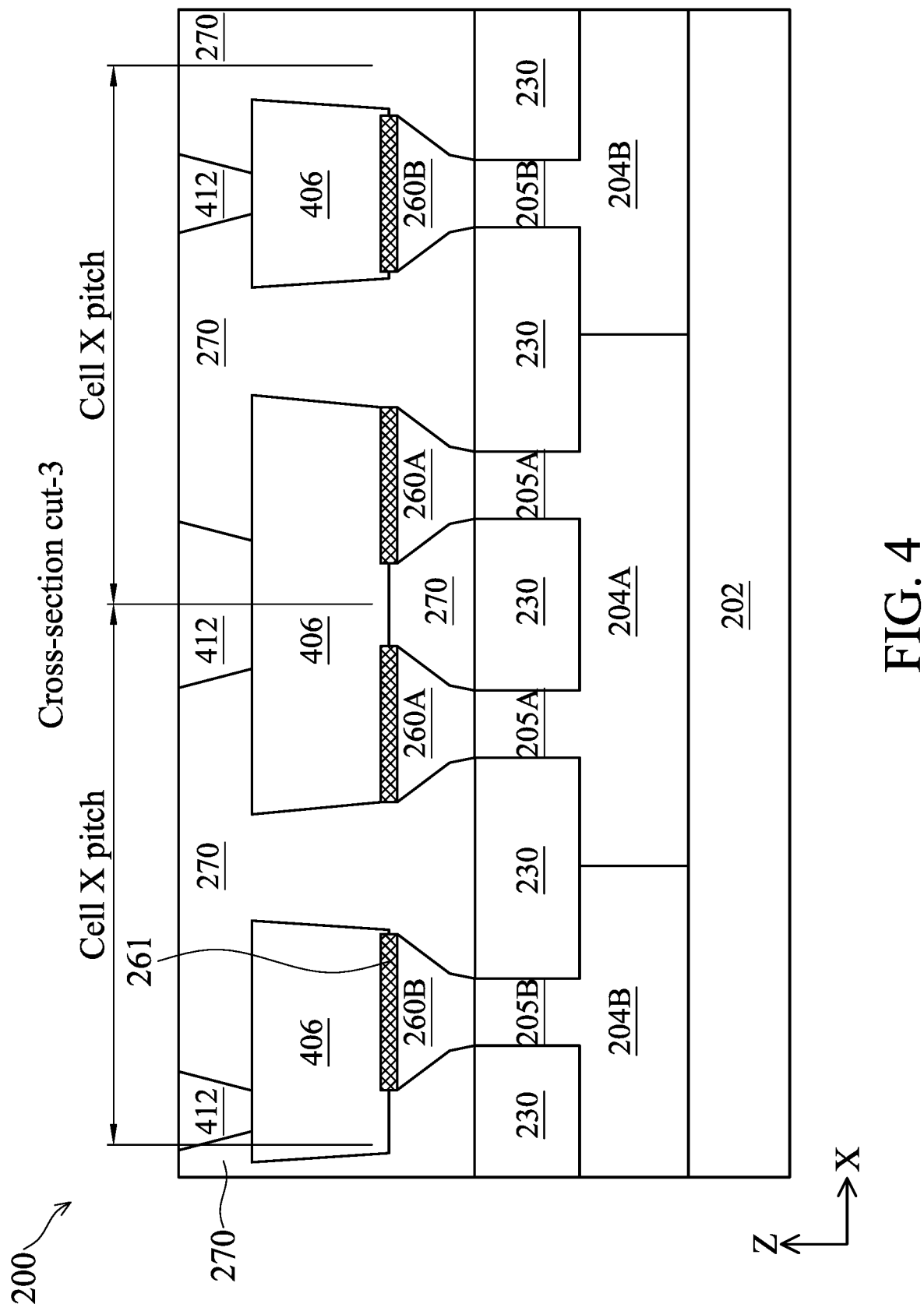
Figure 5:
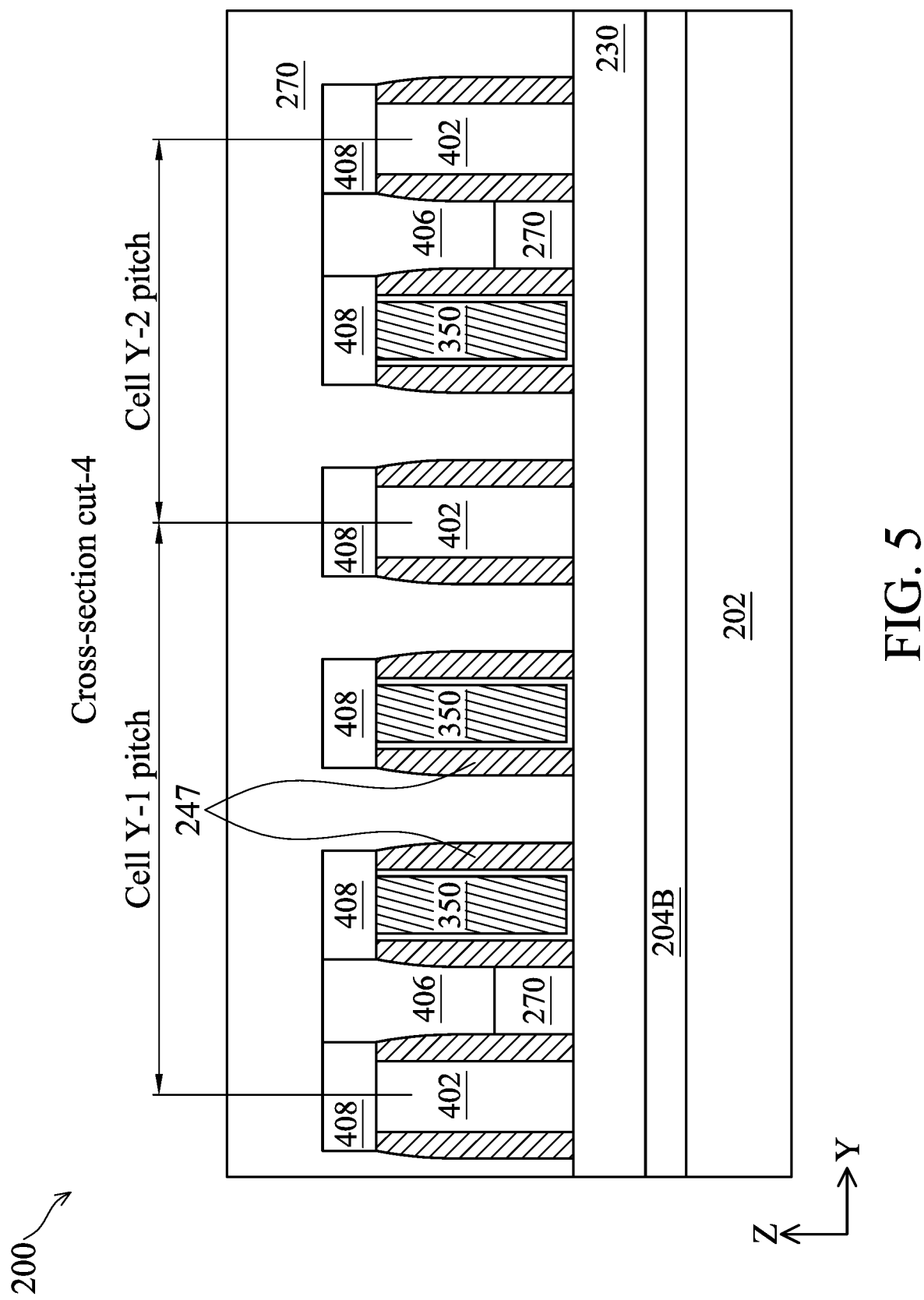
Figure 6:
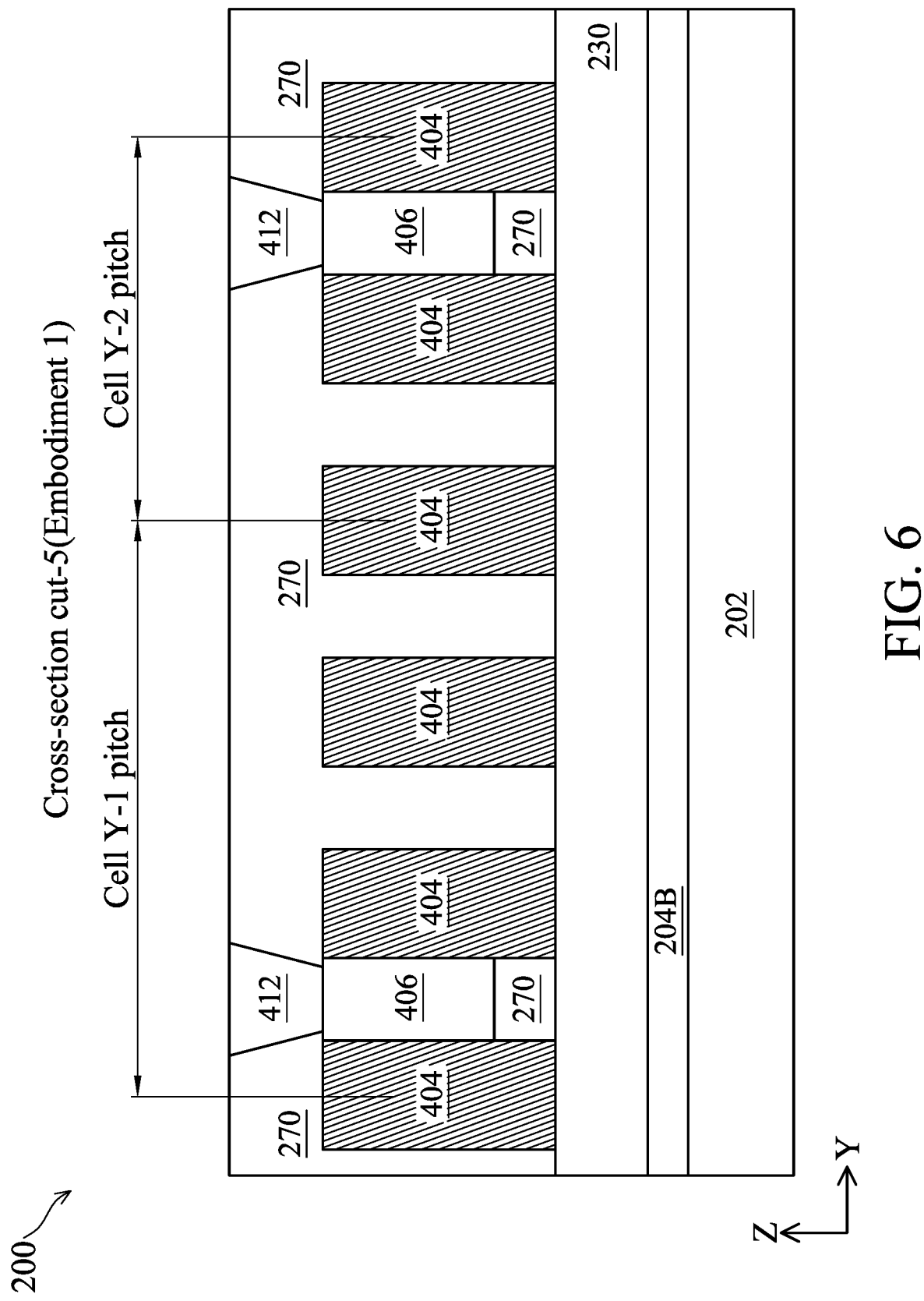
FIG. 6 is a diagrammatic cross-sectional view of the GAA device in FIG. 1, in portion, along the "cut-5" line in FIG. 1, according to an embodiment of the present disclosure.
Figure 7:
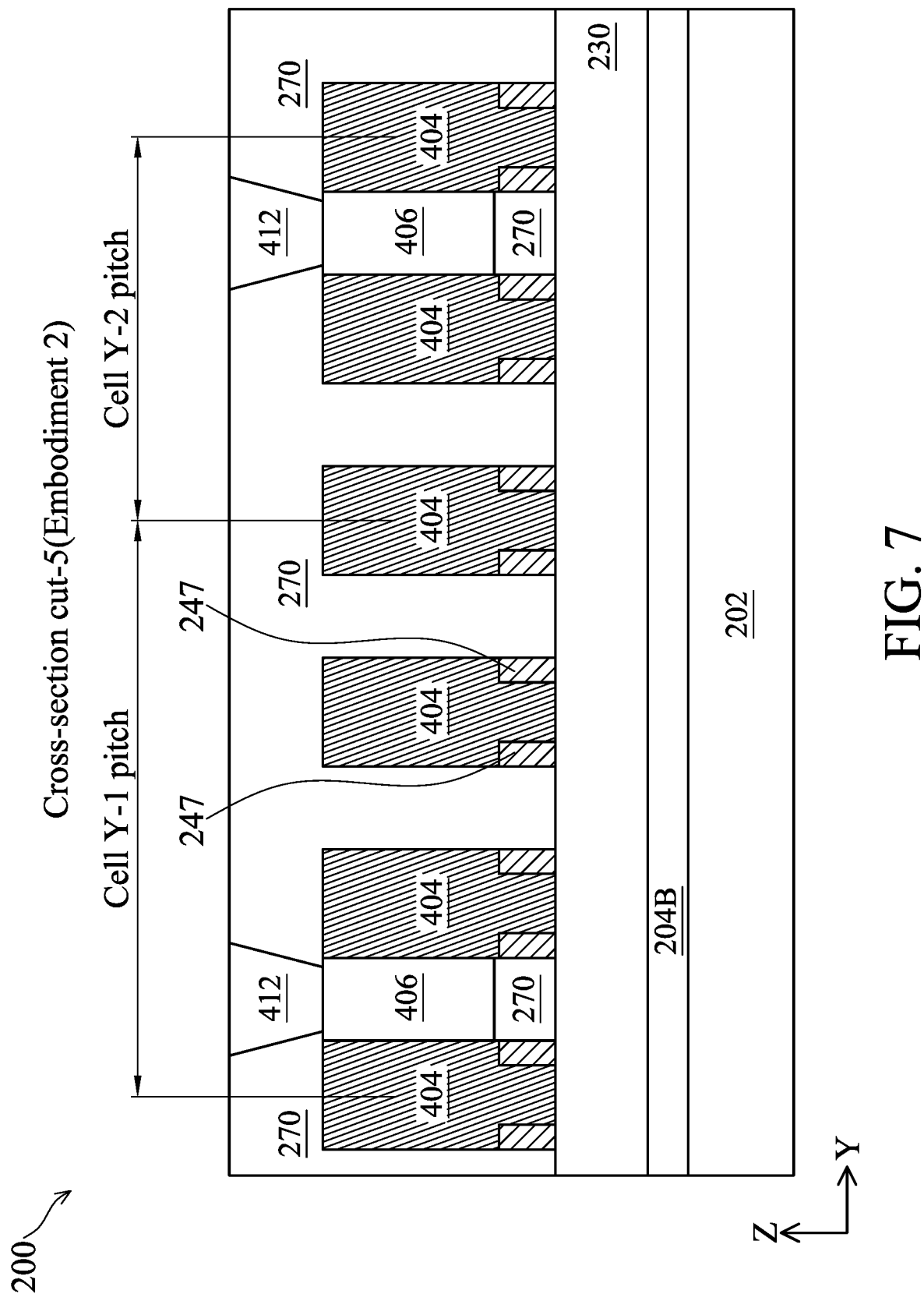
FIG. 7 is a diagrammatic cross-sectional view of the GAA device in FIG. 1, in portion, along the "cut-5" line in FIG. 1, according to another embodiment of the present disclosure.

FIGS. 2-7 are fragmentary diagrammatic views of a GAA device 200, in portion, according to some embodiments of the present disclosure. Particularly, FIG. 1 is a top views of the device 200 in an X-Y plane; FIGS. 2, 3, 4, 5 are diagrammatic cross-sectional views of the GAA device in FIG. 1, in portion, along the "cut-1" line, the "cut-2" line, the "cut-3" line, and the "cut-4" line in FIG. 1 respectively, according to some embodiments of the present disclosure; FIG. 6 is a diagrammatic cross-sectional view of the GAA device in FIG. 1, in portion, along the "cut-5" line in FIG. 1, according to an embodiment of the present disclosure; FIG. 7 is a diagrammatic cross-sectional view of the GAA device in FIG. 1, in portion, along the "cut-5" line in FIG. 1, according to another embodiment of the present disclosure.

In some embodiments, the device 200 may be included in a microprocessor, a memory, and/or other IC device. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 7 have been simplified for the sake of clarity to better understand the inventive concepts of the present disclosure. Additional features can be added in the device 200, and some of the features described below can be replaced, modified, or eliminated in other embodiments of the device 200.

Turning to FIG. 1, the device 200 includes multiple standard (STD) cells where each standard cell includes multiple transistors. The standard cells are separated and isolated from each other by dielectric gates 402 and gate-end dielectric features 404. In other words, the dielectric gates 402 and gate-end dielectric features 404 are disposed along the boundary of the STD cells. The transistors are formed by (or include) gate stacks 240 (oriented lengthwise along the "x" direction) disposed over active regions 204B and 204A (oriented lengthwise along the "y" direction). The device 200 also includes gate sidewall spacers 247 that are disposed along the sidewalls of the gate stacks 240 along the "x" direction.

Figure 2:
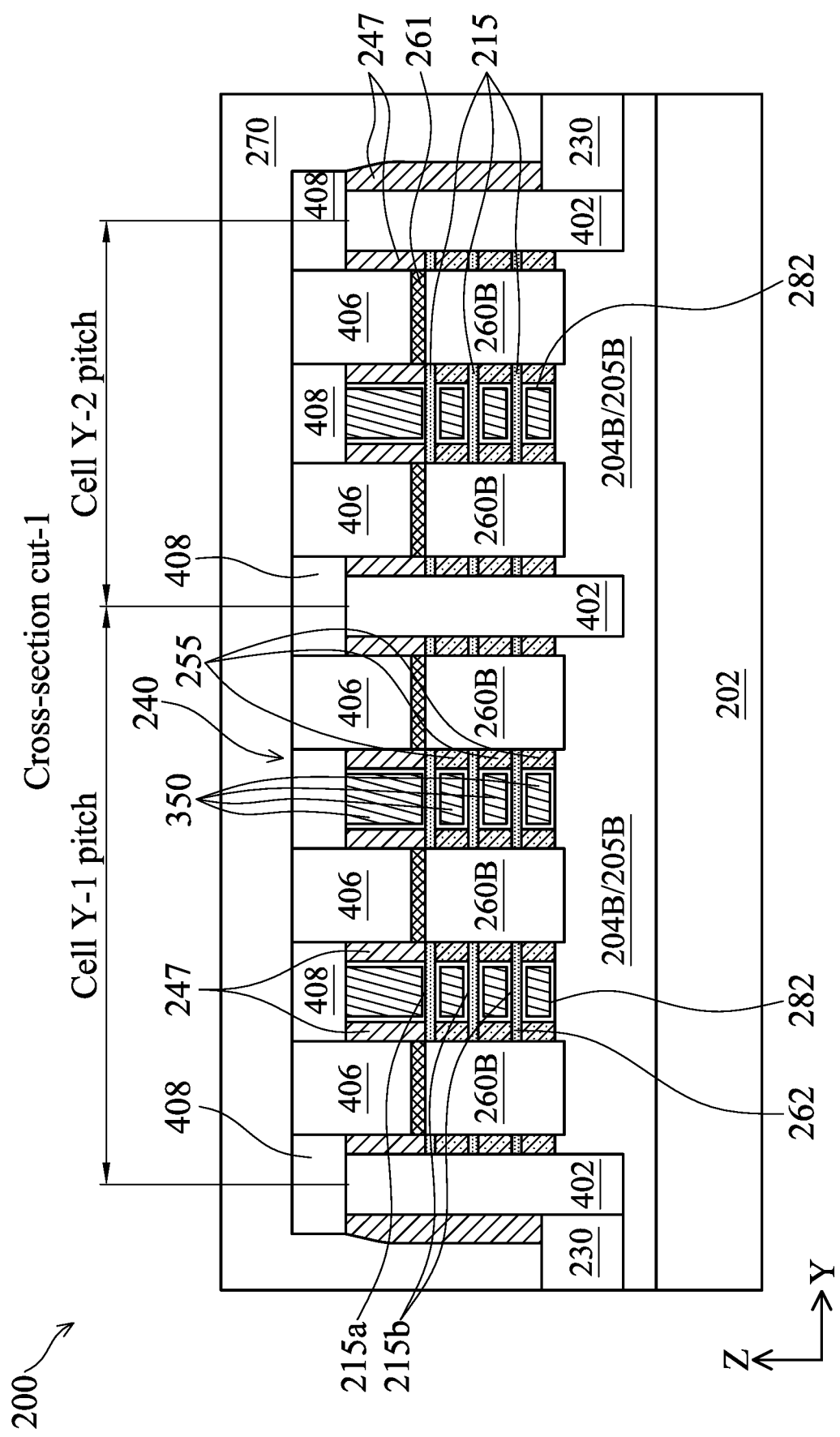
FIGS. 2, 3, 4, 5 are diagrammatic cross-sectional views of the GAA device in FIG. 1, in portion, along the "cut-1" line, the "cut-2" line, the "cut-3" line, and the "cut-4" line in FIG. 1 respectively, according to some embodiments of the present disclosure.
Figure 3:
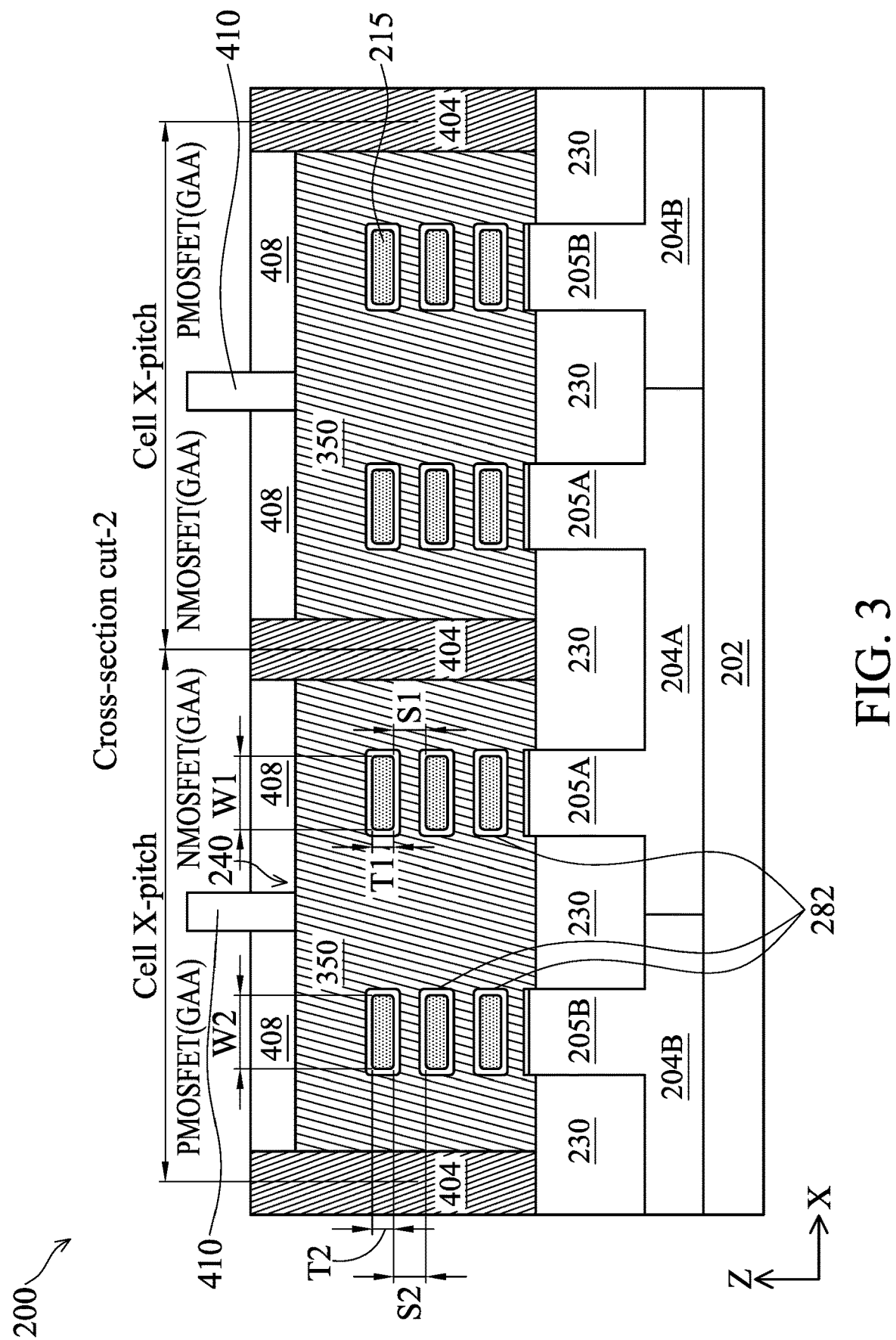

Referring to FIGS. 2 and 3, the device 200 includes a substrate 202, over which the various features including the gate stacks 240 and the active regions 204A and 204B are formed. In the depicted embodiment, substrate 202 includes silicon, such as a silicon wafer. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of the device 200.

In the present embodiment, the active regions 204A are p-type doped regions (referred to hereinafter as a p-well), which can be configured for n-type GAA transistors, and the active regions 204B are n-type doped regions (referred to hereinafter as an n-well), which can be configured for p-type GAA transistors. N-type doped regions, such as n-well 204B, are doped with n-type dopants, such as phosphorus, arsenic, other n-type dopant, or combinations thereof. P-type doped regions, such as p-well 204A, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

As shown in FIGS. 3 and 4, the device 200 further includes fins 205A and 205B disposed over the doped regions 204A and 204B respectively. In some embodiments, fins 205A and 205B are formed by patterning upper portions of the doped regions 204A and 204B, respectively, into the shapes of fins. The fins 205A and 205B may be patterned by any suitable method. For example, the fins 205A and 205B may be patterned using one or more photolithography processes, including double-patterning or multi-patterning processes.

As shown in FIGS. 3 and 4, the device 200 further includes an isolation feature 230 over the substrate 202 and isolating the fins 205A and 205B from each other. Isolation features 230 may include silicon oxide, silicon nitride, silicon oxynitride, other suitable isolation material (for example, including silicon, oxygen, nitrogen, carbon, or other suitable isolation constituent), or combinations thereof. Isolation features 230 may include different structures, such as shallow trench isolation (STI) structures, deep trench isolation (DTI) structures, and/or local oxidation of silicon (LOCOS) structures. For example, isolation features 230 can include STI features that define and electrically isolate fins 205A and 205B from other active device regions (such as fins) and/or passive device regions. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

As shown in FIGS. 2 and 4, the device 200 further includes n-type doped source/drain features 260A disposed over the p-type doped regions 204A and the fins 205A for forming NMOSFET, and p-type doped source/drain features 260B disposed over the n-type doped regions 204B and fins 205B for forming PMOSFET. The source/drain features 260A and 260B may be formed using epitaxial growth. For example, a semiconductor material is epitaxially grown from portions of substrate 202, fins 205A/B, and semiconductor layers 215, forming epitaxial source/drain features 260A and 260B. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor fins 205A/B. In some embodiments, the epitaxial source/drain features 260A may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260B may include silicon germanium or germanium and may be doped with boron, other p-type dopant, or combinations thereof (for example, forming Si:Ge:B epitaxial source/drain features). In some embodiments, epitaxial source/drain features 260A and/or 260B include more than one epitaxial semiconductor layer, where the epitaxial semiconductor layers can include the same or different materials and/or dopant concentrations. In some embodiments, epitaxial source/drain features 260A, 260B include materials and/or dopants that achieve desired tensile stress and/or compressive stress in respective channel regions of the GAA transistors. In some embodiments, epitaxial source/drain features 260A, 260B are doped during deposition by adding impurities to a source material of the epitaxy process (i.e., in-situ). In some embodiments, epitaxial source/drain features 260A, 260B are doped by an ion implantation process subsequent to a deposition process. In some embodiments, annealing processes (e.g., rapid thermal annealing (RTA) and/or laser annealing) are performed to activate dopants in epitaxial source/drain features 260A, 260B and/or other source/drain regions (for example, heavily doped source/drain regions and/or lightly doped source/drain (LDD) regions). In some embodiments, epitaxial source/drain features 260A, 260B are formed in separate processing sequences that include, for example, masking p-type GAA transistor regions when forming epitaxial source/drain features 260A in n-type GAA transistor regions and masking n-type GAA transistor regions when forming epitaxial source/drain features 260B in p-type GAA transistor regions.

As shown in FIGS. 2 and 3, the device 200 further includes a stack of semiconductor layers 215 suspended between each pair of the source/drain features 260A and another stack of semiconductor layers 215 suspended between each pair of the source/drain features 260B. The stack of semiconductor layers 215 serve as the transistor channels for the GAA devices. Accordingly, the semiconductor layers 215 are also referred to as channel layers 215. The channel layers 215 may include single crystalline silicon. Alternatively, the channel layers 215 may comprise germanium, silicon germanium, or another suitable semiconductor material(s). Initially, the channel layers 215 are formed as part of a semiconductor layer stack that includes the channel layers 215 and other semiconductor layers of a different material. As part of the process of forming the fins 205A and 205B, the semiconductor layer stack is also patterned into fins protruding above the substrate 202. During a gate replacement process, the semiconductor layer stack is selectively etched to remove the other semiconductor layers, leaving the channel layers 215 suspended over the substrate 202 and between the respective source/drain features 260A, 260B. This is also referred to as a channel release process.

As shown in FIG. 3, the channel layers 215 for NMOSFET GAA are separated from each other by a spacing S1 along the z-direction, and the channel layers 215 for PMOSFET GAA are separated from each other by a spacing S2 along the z-direction. In the depicted embodiment, spacing S1 is about equal to S2, though the present disclosure contemplates embodiments where spacing S1 is different than spacing S2. Further, channel layers 215 for NMOSFET GAA have a width W1 along the "x" direction and a thickness "T1" along the "z" direction, and channel layers 215 for PMOSFET GAA have a width W2 along the "x" direction and a thickness "T2" along the "z" direction. In the depicted embodiment, thickness T1 is about equal to thickness T2, though the present disclosure contemplates embodiments where thickness T1 is different than thickness T2. In an embodiment, width W1 is about equal to width W2. In another embodiment, width W2 is greater than width W1 to boost PMOS device's performance for balanced CMOS designs. For example, a ratio of width W2 to width W1 may be in a range of 1.05 to 2, although the present disclosure contemplates embodiments where width W1 and width W2 have other configurations including that W1 is greater than W2. In some embodiments, width W1 and/or width W2 is about 4 nm to about 10 nm. In some embodiments, each channel layer 215 has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure. In some embodiments, the channel layers 215 may be cylindrical-shaped (e.g., nanowire), rectangular-shaped (e.g., nanobar), sheet-shaped (e.g., nanosheet), etc.), or have other suitable shapes. In the present disclosure, for the convenience of discussion, the topmost channel layer 215 is labeled as 215a while other channel layers 215 is labeled as 215b.

As shown in FIGS. 1, 2, and 3, the gate stacks 240 includes a gate dielectric layer 282 and a gate electrode layer 350. The gate stack 240 for a PMOSFET GAA is disposed between a pair of p-type source/drain features 260B, and the gate stack 240 for an NMOSFET GAA is disposed between a pair of n-type source/drain features 260A. Some gate stacks 240 may connect (or straddle) a PMOSFET GAA and an NMOSFET GAA. The gate dielectric layer 282 wraps around each of the semiconductor layers 215. The gate dielectric layer 282 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 282 may be formed by chemical oxidation, thermal oxidation, atomic layer deposition (ALD), chemical vapor deposition (CVD), and/or other suitable methods. In some embodiments, the gate stack 240 further includes an interfacial layer between the gate dielectric layer 282 and the channel layers 215. The interfacial layer may include silicon dioxide, silicon oxynitride, or other suitable materials. In some embodiments, the gate electrode layer 350 includes an n-type work function layer for NMOSFET GAA device or a p-type work function layer for PMOSFET GAA device and further includes a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

As shown in FIGS. 1 and 2, the device 200 includes gate spacers 247 on sidewalls of the gate stack 240 and above the top channel layer 215a, and further includes gate spacers 255 on sidewalls of the gate stack 240 and below the top channel layer 215a. In the present disclosure, the gate spacers 247 are also referred to as outer spacers 247 or top spacers 247, and the gate spacers 255 are also referred to as inner spacers 255. The inner spacers 255 are disposed laterally between the source/drain features 260A (or 260B) and the gate stacks 240 and vertically between the channel layers 215. In the present embodiment, the device 200 further includes lightly doped source/drain (LDD) regions 262 that are between each channel layer 215 and the S/D features (or heavily doped S/D) 260A/B. The LDD regions 262 between channel layers 215b and S/D features 260A/B are surrounded by inner spacers 255, and the LDD regions 262 between channel layer 215a and S/D features 260A/B are surrounded by both inner spacer 255 and top spacer 247. The LDD regions 262 provide further device performance enhance (such as short channel control) to the GAA device 200. In an embodiment, the materials for the inner spacers 255 and the top spacers 247 are different. The device 200 further includes dummy dielectric gates (or isolation gates) 402 that are oriented lengthwise parallel to the gate stacks 240. The dielectric gates 402 isolate adjacent STD cells along the "x" direction. The top spacers 247 are also disposed over sidewalls of the dielectric gates 402.

As shown in FIGS. 1 and 3, The device 200 further includes gate-end dielectric features 404 that are disposed between an end of a gate stack 240 and an end of another gate stack 240, between an end of a gate stack 240 and an end of a dielectric gate 402, and between an end of a dielectric gate 402 and an end of another dielectric gate 402. The gate-end dielectric features 404 also separate the top spacers 247 along the "x" direction. The top spacers 247, inner spacers 255, dielectric gates 402, and gate-end dielectric features 404 collectively provide isolation functions—isolating the gate stacks 240 from each other and from nearby conductors including source/drain features 260A and 260B and source/drain contacts 406 (FIG. 2). As device integration continues to increase, such isolation becomes more and more desirable. The materials for the top spacers 247, inner spacers 255, dielectric gates 402, and gate-end dielectric features 404 are selected to provide excellent isolation with small dimensions (thicknesses). Further, the materials for the top spacers 247, inner spacers 255, dielectric gates 402, and gate-end dielectric features 404 are selected to provide low stray (or coupling) capacitance to meet high speed performance.

In an embodiment, the materials for the top spacers 247, inner spacers 255, and gate-end dielectric features 404 are different from each other and the gate-end dielectric features 404 have the highest dielectric constant among the three. In an embodiment, the gate-end dielectric features 404 include a high-k material, such as selected from a group consisting of $Si_3N_4$, nitrogen-containing oxide, carbon-containing oxide, dielectric metal oxide such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba, Sr)TiO_3$ (BST), hafnium dioxide-alumina ($HfO_2$—$Al_2O_3$) alloy, other suitable high-k dielectric material, or combinations thereof. In a further embodiment, the inner spacers 255 have a higher effective dielectric constant than the top spacers 247. For example, the inner spacers 255 may include a material selected from a group consisting of $SiO_2$, $Si_3N_4$, SiON, SiOC, SiOCN, nitride base dielectric material, air gap, or a combination thereof; and the top spacers 247 may include a material selected from a group consisting of $SiO_2$, $Si_3N_4$, carbon doped oxide, nitrogen doped oxide, porous oxide, air gap, or a combination thereof. The dielectric gates (or isolation gates) 402 may include a dielectric material such as $SiO_2$, SiON, $Si_3N_4$, high-k dielectric, or a combination thereof. Example processes of forming the dielectric gates 402 are disclosed in U.S. Pat. Nos. 9,613,953, 9,805, 985, and 9,793,273 assigned to the same assignee as the present application, which are herein incorporated by reference.

As shown in FIGS. 2 and 3, the device 200 further includes a gate-top dielectric layer 408 that is disposed over each of the gate stacks 240 and the dielectric gates 402. In an embodiment, the thickness of the gate-top dielectric layer 408 is in a range of about 2 nm to about 60 nm. The gate-top dielectric layer 408 may include a material selected from the group consisting of silicon oxide, SiOC, SiON, SiOCN, nitride base dielectric, dielectric metal oxide such as Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. The gate-top dielectric layer 408 may be formed by recessing the gate stacks 240, the dielectric gates 402, and the top spacers 247 to form trenches, filling the trenches with one or more dielectric materials, and performing a CMP process to remove excessive dielectric materials.

As shown in FIGS. 2 and 4, the device 200 further includes silicide features 261 over the source/drain features 260A and 260B, and source/drain contacts 406 over the silicide features 261. The silicide features 261 may be formed by depositing one or more metals over the S/D features 260A/B, performing an annealing process to the device 200 to cause reaction between the one or more metals and the S/D features 260A/B to produce the silicide features 261, and removing un-reacted portions of the one or more metals. The silicide features 261 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (Yb Si), platinum silicide (PtSi), iridium silicide (IrSi), erbium silicide (ErSi), cobalt silicide (CoSi), or other suitable compounds. In an embodiment, the S/D contacts 406 may include a conductive barrier layer and a metal fill layer over the conductive barrier layer. The conductive barrier layer functions to prevent metal materials of the metal fill layer from diffusing into the dielectric layers adjacent the S/D contacts 406. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 406.

In an embodiment, the silicide features 261 and source/drain contacts 406 are formed by etching S/D contact holes using a self-aligned etching process and then performing the above disclosed deposition, annealing, and other processes in the contact holes to form the silicide features 261 and source/drain contacts 406. The self-aligned etching process uses the gate-top dielectric layer 408, the top spacers 247, and/or the gate-end dielectric features 404 as an etch mask. Example methods of forming self-aligned source/drain contacts are disclosed in U.S. Pat. Nos. 7,026,689 and 7,419,898, assigned to the same assignee as the present application, which are herein incorporated by reference.

FIG. 5 illustrates an example where the source/drain contacts 406 are formed in a space self-aligned to sidewalls of the gate-top dielectric layer 408 and the top spacers 247. FIGS. 6 and 7 illustrate examples where the source/drain contacts 406 are formed in a space self-ligned to sidewalls of the gate-end dielectric features 404. The self-aligned etching process applies an etchant that is tuned to etch an inter-layer dielectric (ILD) layer 270 (discussed below) and with no (or minimal) etching to the gate-top dielectric layer 408, the top spacers 247, and the gate-end dielectric features 404, thereby forming contact holes aligned to the sidewalls of the gate-top dielectric layer 408, the top spacers 247, and the gate-end dielectric features 404. FIG. 5 also shows that in the STI region (i.e., where the gate stacks 240 and the dielectric gates 402 are disposed directly on the isolation features 230), the sidewalls of the gate stacks 240 and the dielectric gates 402 are covered by the top spacers 247, and there is no inner spacer 255.

As shown in FIGS. 2 and 4, the device 200 further includes an inter-layer dielectric (ILD) layer 270. The ILD layer 270 is disposed over the isolation features 230. The various features including the S/D features 260A/B, the silicide features 261, the source/drain contacts 406, the gate stacks 240, the dielectric gates 402, the top spacers 247, the inner spacers 255, the gate-end dielectric features 404, and the gate-top dielectric layer 408 are embedded in the ILD layer 270. In some embodiments, the device 200 further includes a contact etch stop layer (CESL) between the ILD layer 270 and the S/D features 260A/B, the gate stacks 240, the dielectric gates 402, and the top spacers 247. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

As shown in FIGS. 1 and 3, the device 200 further includes gate vias 410 that are electrically connected to the gate stacks 240. As shown in FIGS. 1 and 4, the device 200 further includes S/D contact vias 412 that are electrically connected to the S/D contacts 406. Each of the gate vias 410 and S/D contact vias 412 may include a conductive barrier layer and a metal fill layer over the conductive barrier layer. The conductive barrier layer functions to prevent metal materials of the metal fill layer from diffusing into the dielectric layers adjacent the via. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the via.

FIG. 6 illustrates more details of the device 200, particularly the gate-end dielectric features 404, according to an embodiment. As shown in FIG. 6, the gate-end dielectric features 404 are disposed directly on the isolation features 230. There is no top spacer 247 between the gate-end dielectric features 404 and the isolation features 230. In other words, in this embodiment, the gate-end dielectric features 404 fully separate the top spacers 247 that are aligned along the "x" direction (FIG. 1).

FIG. 7 illustrates more details of the device 200, particularly the gate-end dielectric features 404, according to another embodiment. As shown in FIG. 7, the gate-end dielectric features 404 are disposed directly on the isolation features 230. But there is a portion of the top spacer 247 between the gate-end dielectric features 404 and the isolation features 230. In other words, in this embodiment, the gate-end dielectric features 404 does not fully separate the top spacers 247 that are aligned along the "x" direction (FIG. 1), and some portions of the top spacers 247 are disposed on sidewalls of the gate-end dielectric features 404. As will be discussed later, the space occupied by the gate-end dielectric features 404 are initially occupied by the gate stacks 240 (or sacrificial gate stacks which are eventually replaced with the gate stacks 240) and the top spacers 247. In an embodiment, the gate-end dielectric features 404 are formed by cutting the gate stacks 240 (or the sacrificial gate stacks) and the top spacers 247 according to a cut pattern to form trenches and filling the trenches with one or more dielectric materials. The cutting process completely cuts the gate stacks 240 according to the cut pattern but may completely or partially cut the top spacers 247. When the top spacers 247 are completely cut, the gate-end dielectric features 404 are formed with the configuration as shown in FIG. 6. When the top spacers 247 are partially cut, the gate-end dielectric features 404 are formed with the configuration as shown in FIG. 7.

Figure 8:
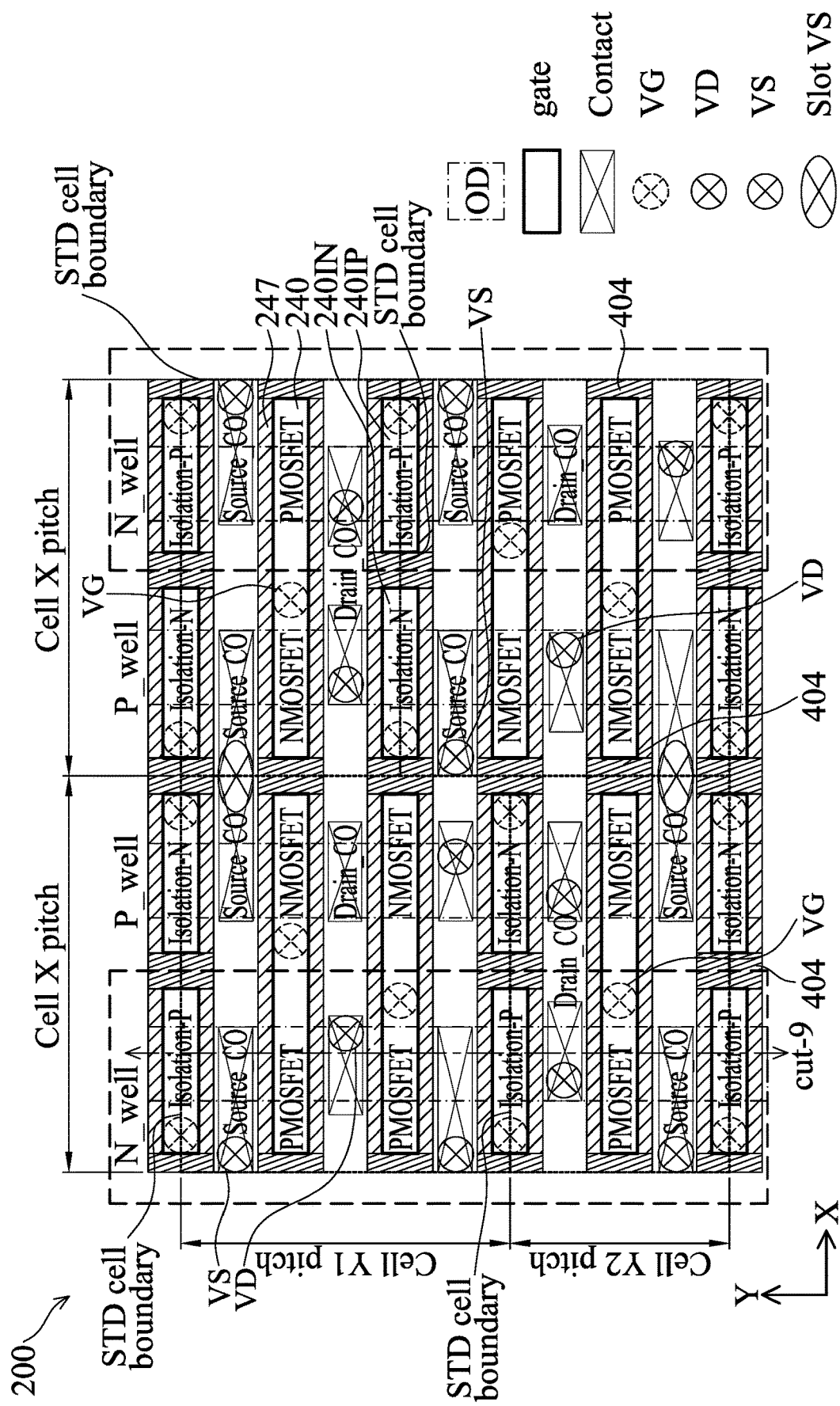
FIG. 8 is a top view of a layout of a GAA device, in portion, according to another embodiment of the present disclosure.
Figure 9:
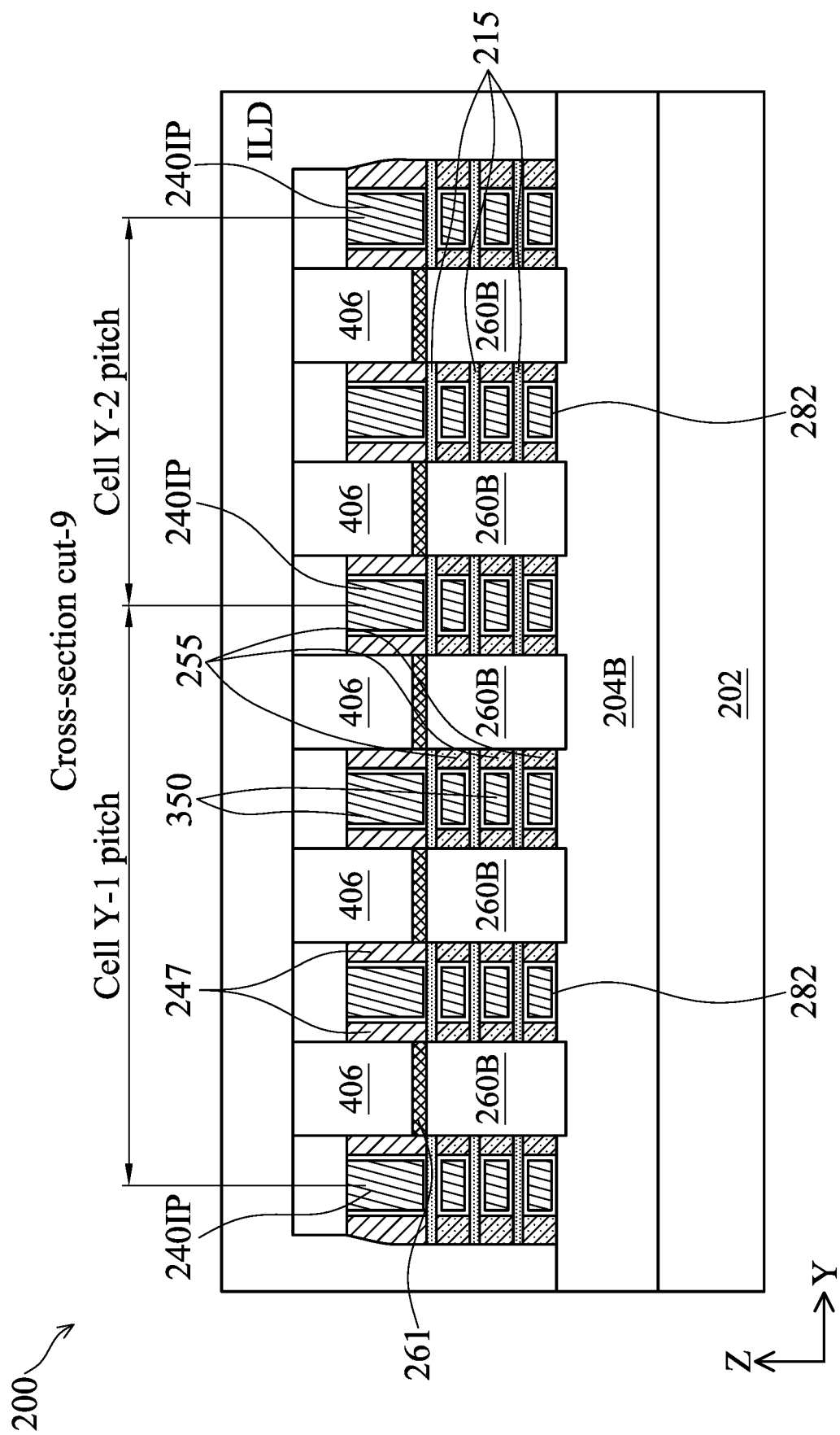
FIG. 9 is a diagrammatic cross-sectional view of the GAA device in FIG. 8, in portion, along the "cut-9" line in FIG. 8, according to an embodiment of the present disclosure.

FIG. 8 illustrate a top view of the device 200, in portion, according to another embodiment (or a second embodiment). FIG. 9 illustrates a cross-sectional view of the device 200, in portion, along the "cut-9" line in FIG. 8, according to the second embodiment. The second embodiment is similar to the embodiment (the first embodiment) discussed above with reference to FIGS. 1-7. One difference is that the dielectric gates 402 in the first embodiment are replaced with dummy metal gates 240IP and 240IN in the second embodiment. The dummy metal gates 240IP and 240IN are separated by gate-end dielectric features 404. The dummy metal gates 240IP has the same structure (e.g., having high-k gate dielectric and metal gate electrode) as the regular, functional metal gate 240 for PMOSFET, but its gate electrode is permanently connected to a voltage potential that turns off the underlying channel. For example, the dummy metal gates 240IP may be permanently connected to Vdd (positive power source). The dummy metal gates 240IN has the same structure (e.g., having high-k gate dielectric and metal gate electrode) as the regular, functional metal gate 240 for NMOSFET, but its gate electrode is permanently connected to a voltage potential that turns off the underlying channel. For example, the dummy metal gates 240IN may be permanently connected to Vss (negative power source) or Ground. The dummy metal gates 240IP and 240IN reduce noise coupling between adjacent STD cells. As shown in FIG. 8, the dummy metal gates 240IP and 240IN and the gate-end dielectric features 404 are disposed along the boundary of the STD cells. Further, the gate-end dielectric features 404 are disposed between an end of a gate stack 240 and an end of another gate stack 240, between an end of a gate stack 240 and an end of a dummy metal gates 240IP or 240IN, and between an end of a dummy metal gate 240IP or 240IN and an end of another dummy metal gate 240IP or 240IN. Other aspects of the second embodiments are the same as the first embodiment. For example, the gate-end dielectric features 404, the isolation features 230, and the top spacers 247 may be arranged as shown in FIG. 6 in an embodiment or as shown in FIG. 7 in another embodiment. For another example, the materials of the gate-end dielectric features 404, the top spacers 247, and the inner spacers 255 are different from each other and the gate-end dielectric features 404 have the highest dielectric constant among the three. In a further example, the inner spacers 255 have a higher effective dielectric constant than the top spacers 247.

Figure 10:
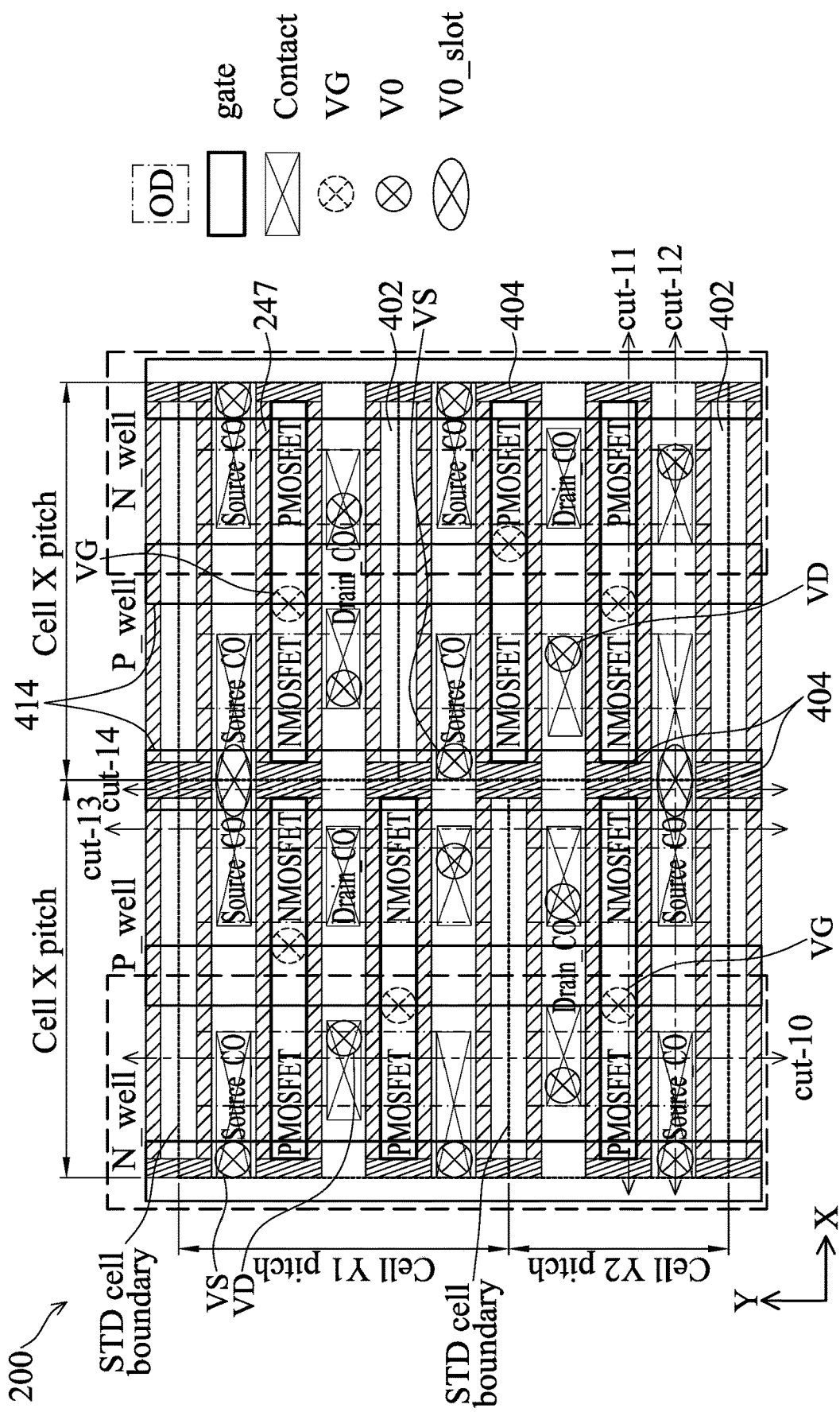
FIG. 10 is a top view of a layout of a GAA device, in portion, according to yet another embodiment of the present disclosure.
Figure 11:
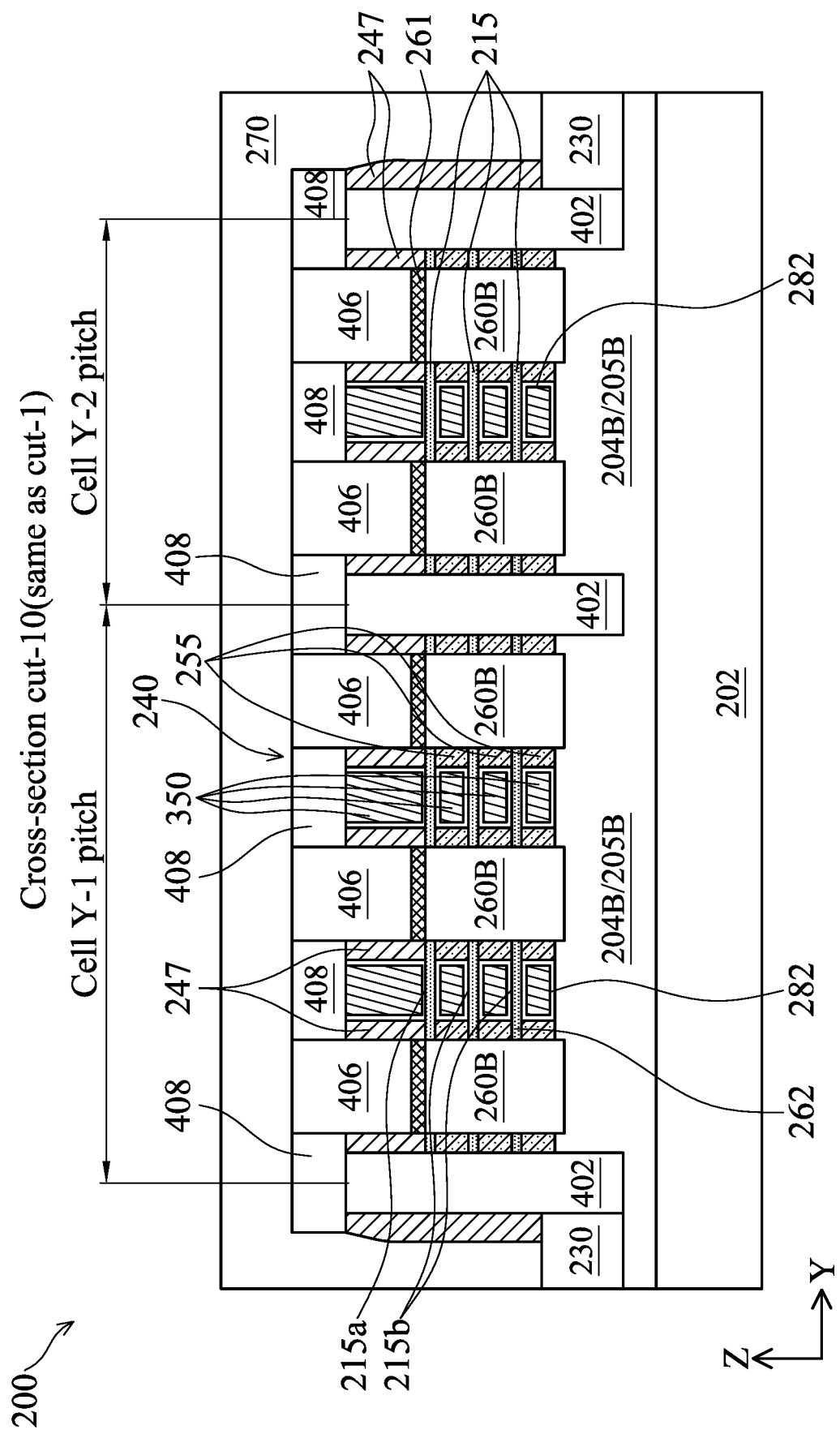
FIGS. 11, 12, 13, 14 are diagrammatic cross-sectional views of the GAA device in FIG. 10, in portion, along the "cut-10" line, the "cut-11" line, the "cut-12" line, and the "cut-13" line in FIG. 10 respectively, according to some embodiments of the present disclosure.
Figure 12:
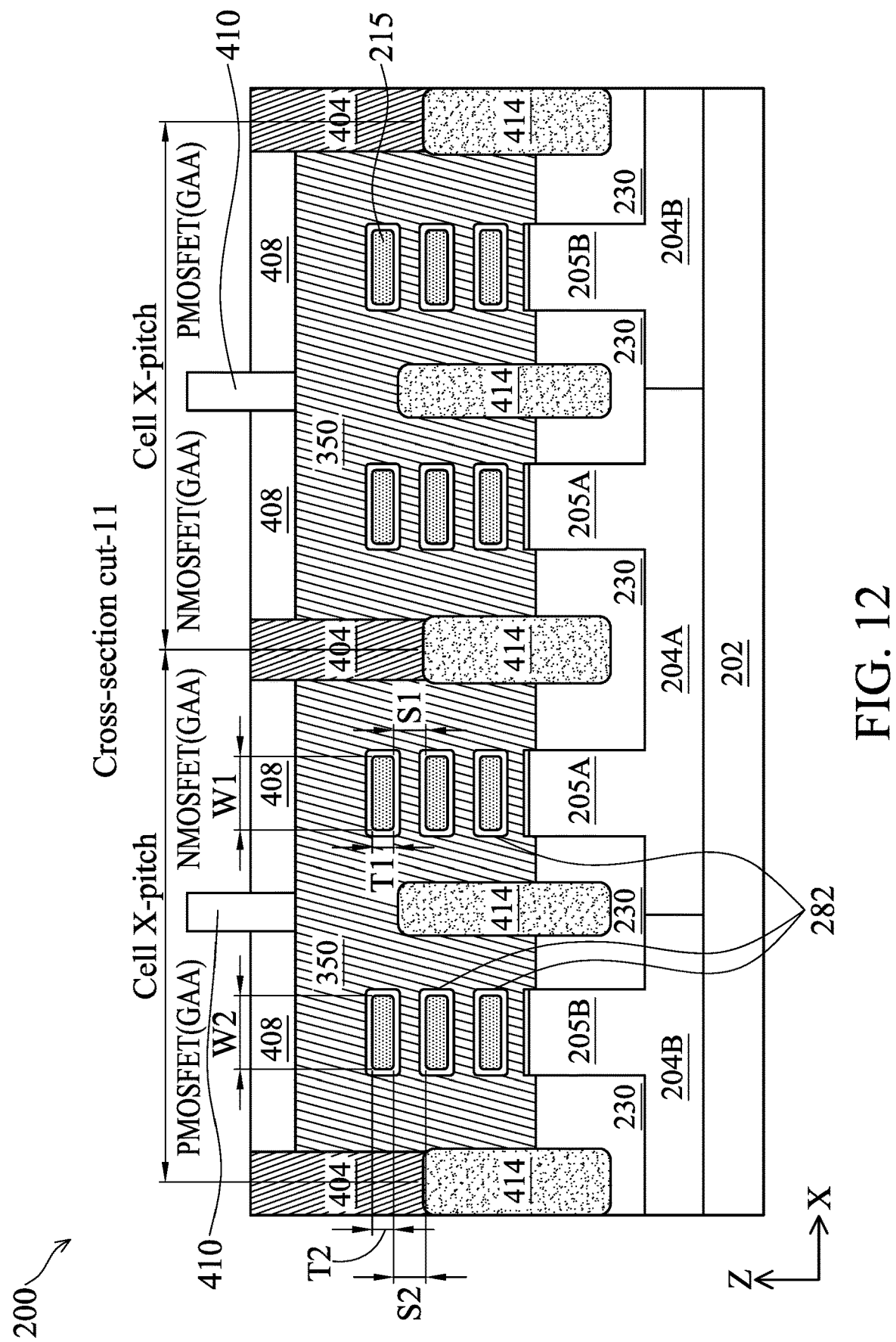
Figure 13:
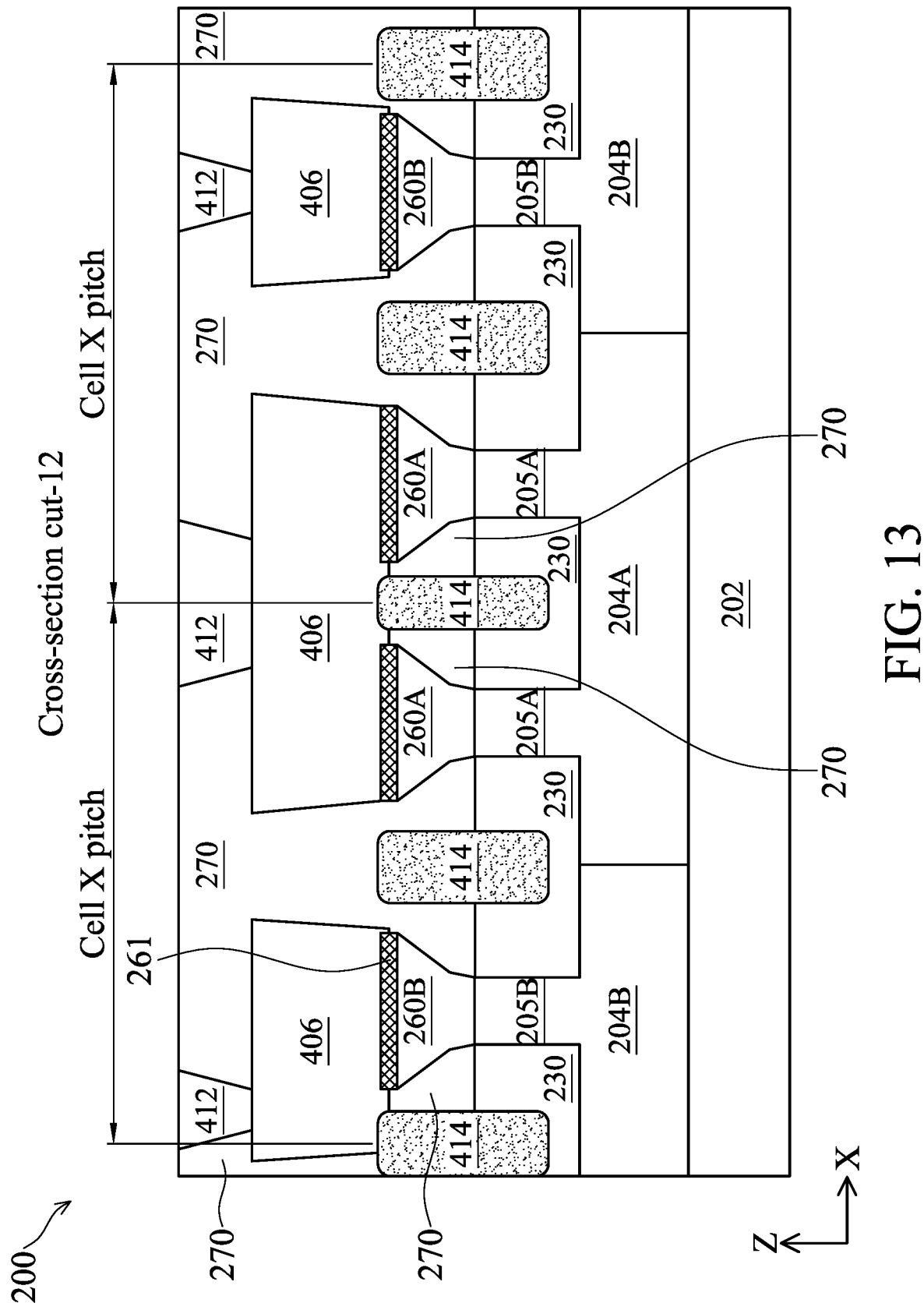
Figure 14:
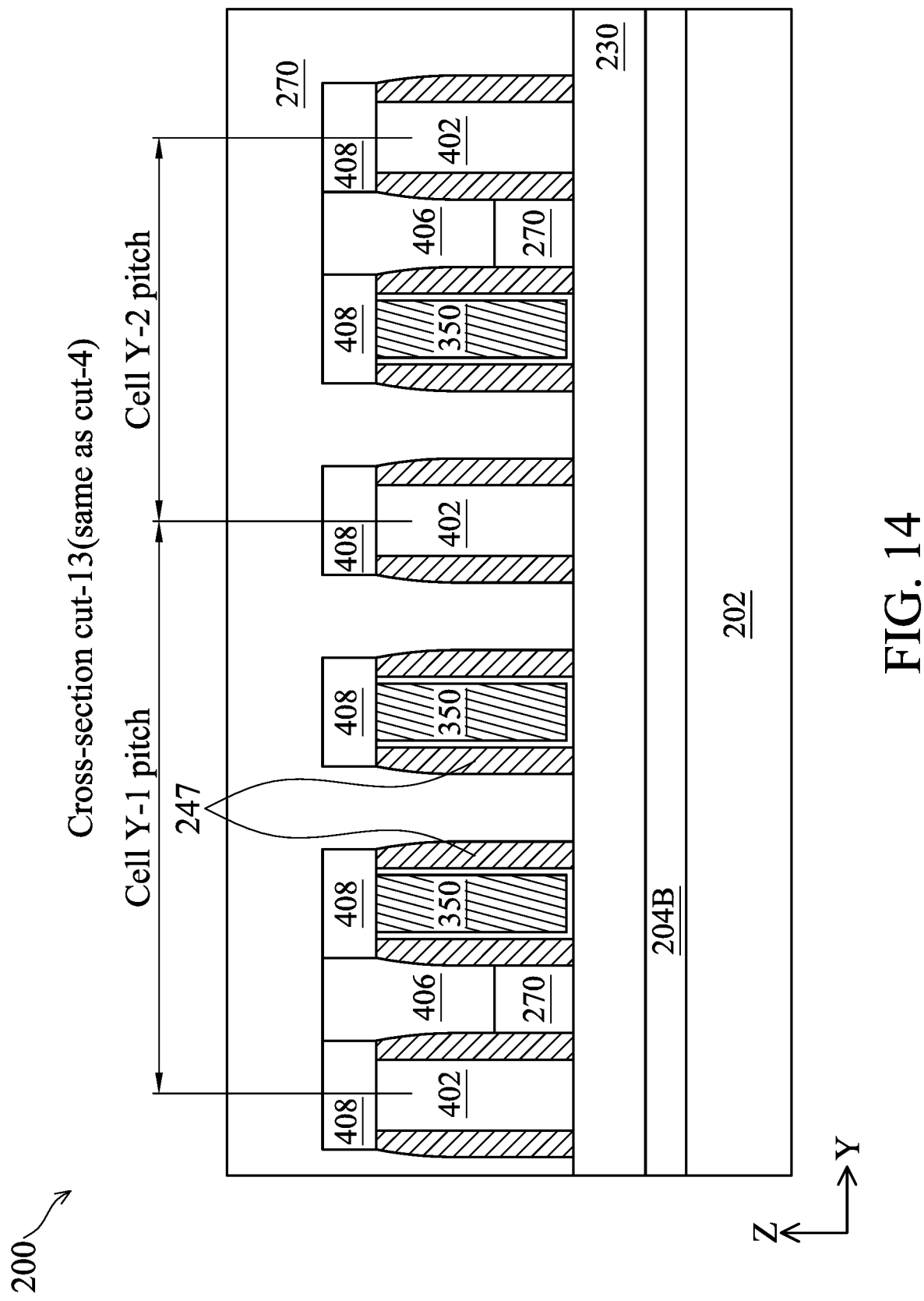

FIG. 10 illustrate a top view of the device 200, in portion, according to yet another embodiment (or a third embodiment). FIGS. 11, 12, 13, and 14 illustrate cross-sectional views of the device 200, in portion, along the "cut-10" line, the "cut-11" line, the "cut-12" line, and the "cut-13" line in FIG. 10, respectively, according to some embodiments. The third embodiment is similar to the embodiment (the first embodiment) discussed above with reference to FIGS. 1-7. Particularly, FIG. 11 is the same as FIG. 2, and FIG. 14 is the same as FIG. 5. One difference is that the third embodiment of the device 200 further includes dielectric lines (or dielectric fins) 414 that are oriented along the "y" direction, parallel to the fins 205A/B discussed earlier. As shown in FIGS. 10 and 12, the dielectric lines 414 are disposed along the boundary of the STD cells and under the gate-end dielectric features 404. Further, some of the dielectric lines 414 are disposed between PMOSFETs and NMOSFETs within the same STD cell. As shown in FIG. 12, the dielectric lines 414 are disposed over the isolation features 230 and between the fins 205A and 205B. The dielectric lines 414 extend above the isolation features 230. Each gate-end dielectric feature 404 is disposed above a dummy dielectric line 414. In some embodiments, each gate-end dielectric feature 404 is center-aligned with the underlying dummy dielectric line 414. Also, the gate electrode 350 connecting a PMOSFET and an NMOSFET is disposed over a dummy dielectric line 414 and the gate via 410 on the gate electrode 350 is substantially center-aligned with the underlying dummy dielectric line 414. As shown in FIG. 13, the dielectric lines 414 are disposed between the S/D features 260A and 260B. Some of the S/D contacts 406 are disposed directly over and in contact with the dielectric lines 414. The dielectric lines 414 further increase the isolation between the S/D features 260A and 260B, between adjacent STD cells, and between adjacent gate stacks 240.

Figure 15:
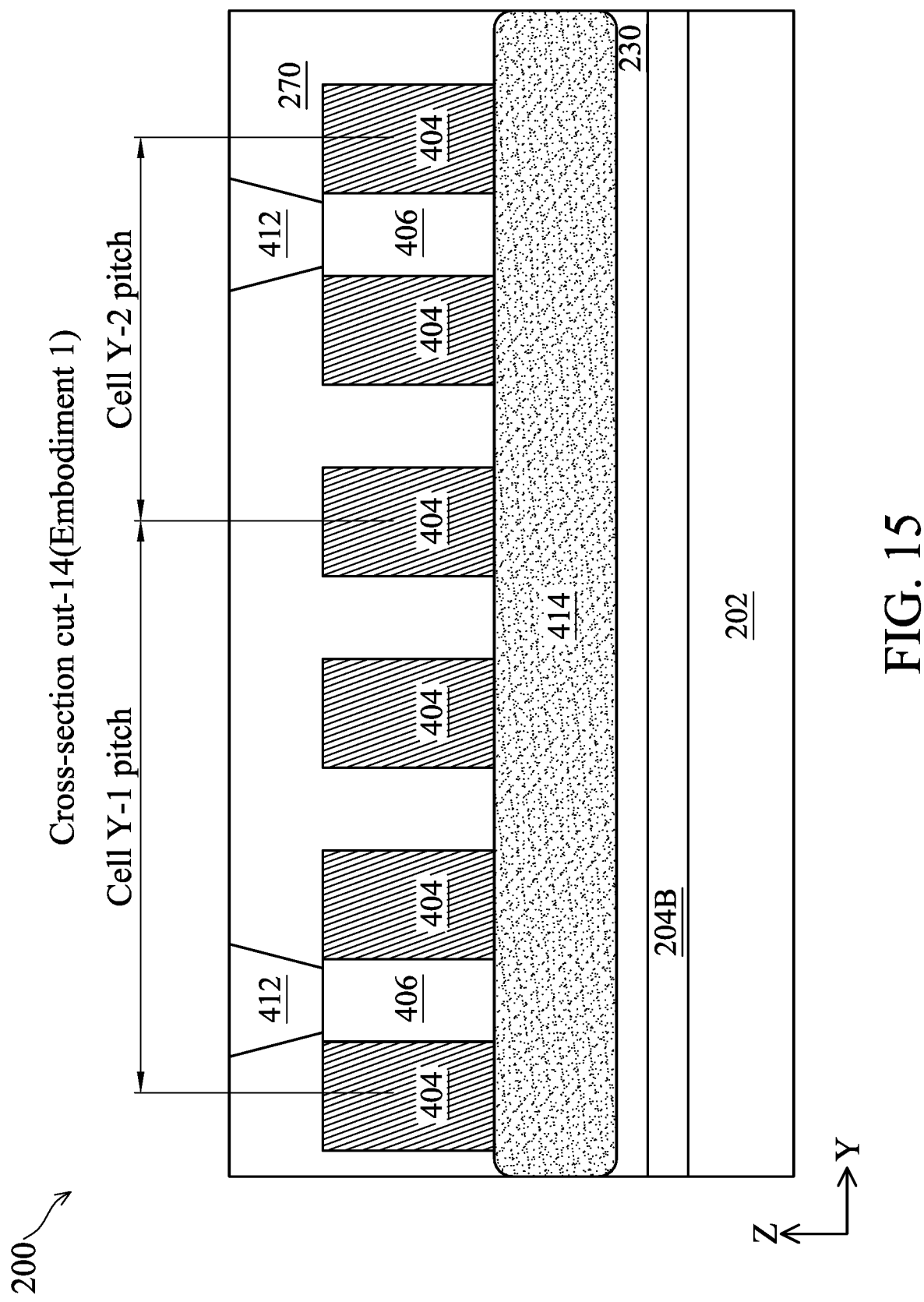
FIG. 15 is a diagrammatic cross-sectional view of the GAA device in FIG. 10, in portion, along the "cut-14" line in FIG. 10, according to an embodiment of the present disclosure.
Figure 16:
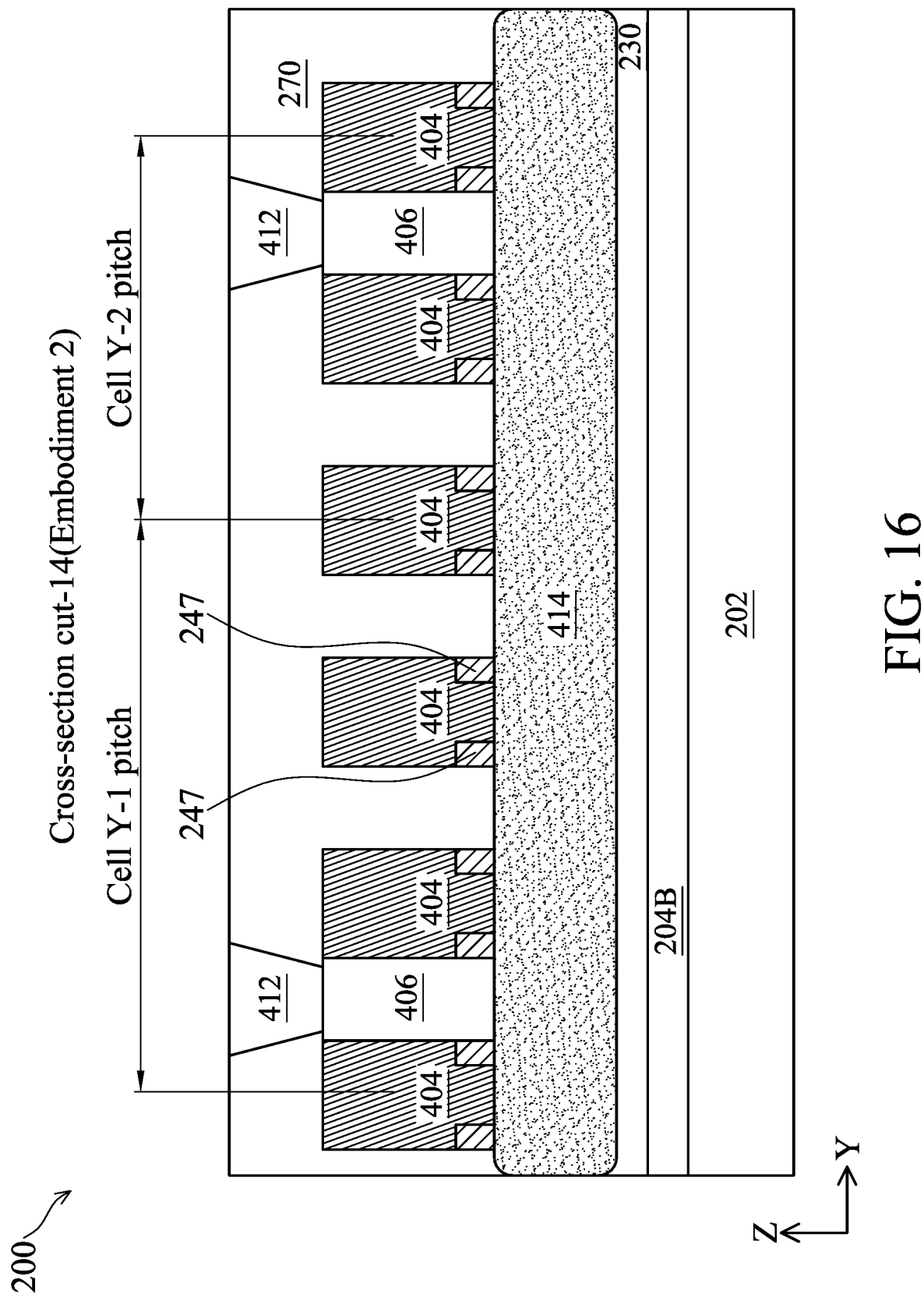
FIG. 16 is a diagrammatic cross-sectional view of the GAA device in FIG. 10, in portion, along the "cut-14" line in FIG. 10, according to another embodiment of the present disclosure.

FIGS. 15 and 16 illustrate cross-sectional views of the device 200, in portion, along the "cut-14" line in FIG. 10 according to two alternative embodiments. Referring to FIG. 15, the dummy dielectric line 414 is disposed over the isolation feature 230, and the gate-end dielectric features 404 are disposed over the dummy dielectric line 414. The S/D contacts 406 are also disposed over the dummy dielectric line 414 in the present embodiment. There is no top spacer 247 over the dummy dielectric line 414 in this cross-sectional view. Referring to FIG. 16, the top spacers 247 are disposed on the dummy dielectric line 414 and adjacent to the lower portion of the gate-end dielectric features 404. The top spacers 247 are also disposed adjacent to the lower portion of the S/D contacts 406 in this embodiment. As will be discussed later, the space occupied by the gate-end dielectric features 404 are initially occupied by the gate stacks 240 (or sacrificial gate stacks which are eventually replaced with the gate stacks 240) and the top spacers 247. In an embodiment, the gate-end dielectric features 404 are formed by cutting the gate stacks 240 (or the sacrificial gate stacks) and the top spacers 247 according to a cut pattern to form trenches and filling the trenches with one or more dielectric materials. The cutting process completely cuts the gate stacks 240 according to the cut pattern but may completely or partially cut the top spacers 247. When the top spacers 247 are completely cut, the gate-end dielectric features 404 are formed with the configuration as shown in FIG. 15. When the top spacers 247 are partially cut, the gate-end dielectric features 404 are formed with the configuration as shown in FIG. 16. The dielectric lines 414 further increase the isolation between the S/D contacts 406 and the isolation features 230.

In various embodiments, the dielectric lines 414 may include a single layer of a dielectric material or multiple layers of dielectric materials. The material(s) of the dielectric lines 414 may include $SiO_2$, SiOC, SiON, SiOCN, carbon-containing oxide, nitrogen-containing oxide, dielectric metal oxides such as Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof.

Figure 17A:
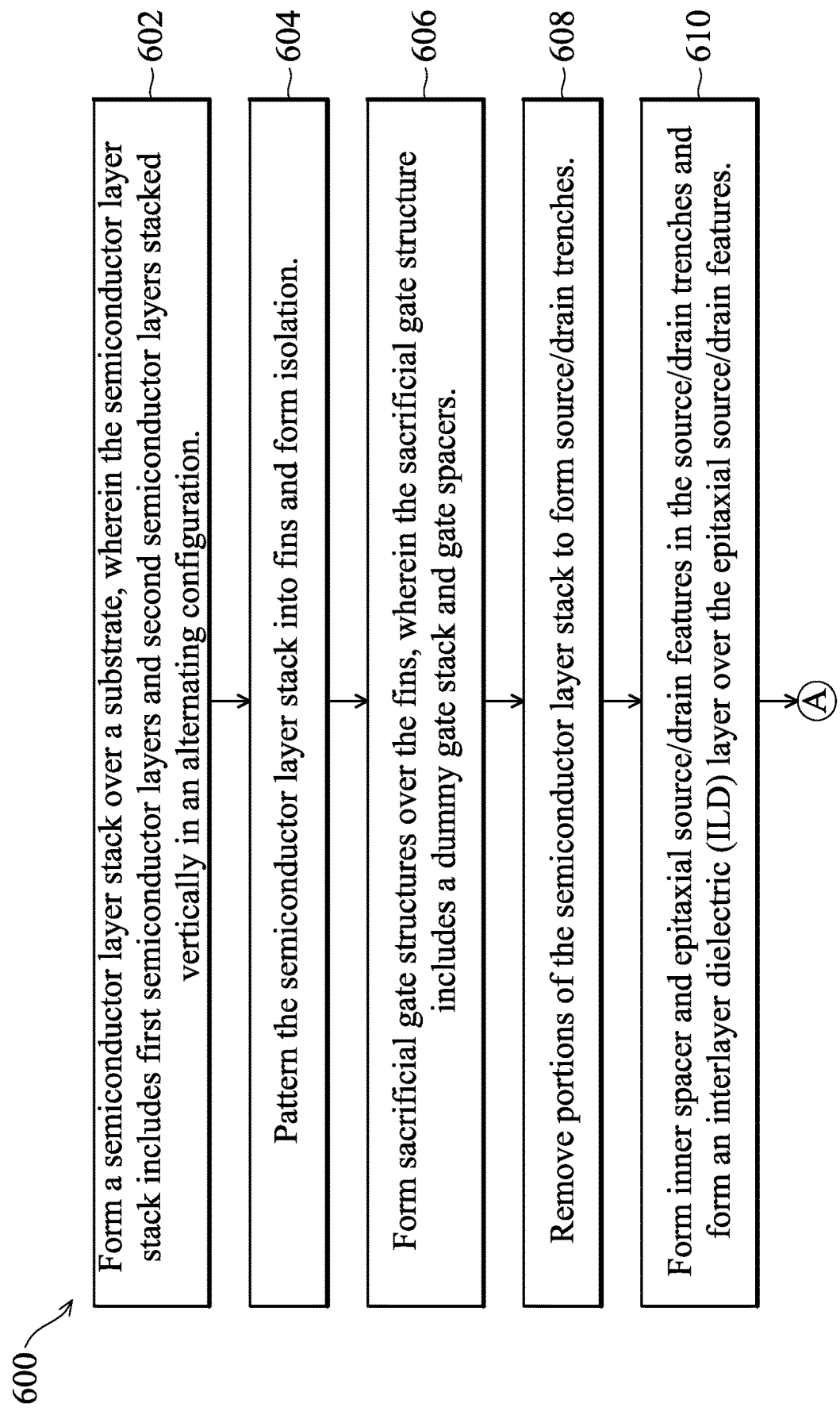
FIGS. 17A, 17B, and 17C are flow charts of a method for fabricating a GAA device according to some embodiments of the present disclosure.
Figures 17B, 17C:
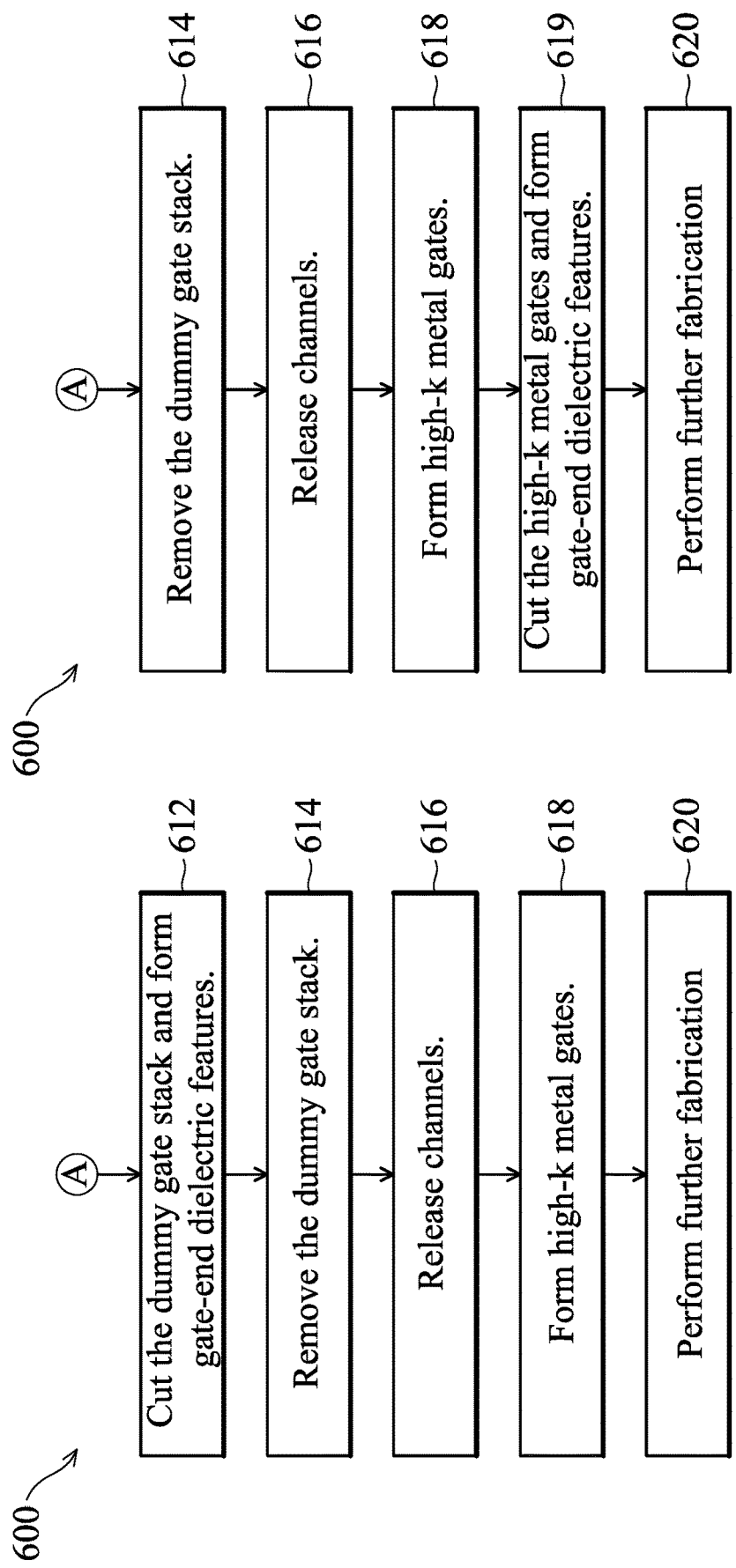

FIGS. 17A, 17B, and 17C are a flow chart of a method 600 for fabricating a multi-gate device, such as the device 200, according to various aspects of the present disclosure. Method 600 is briefly described below in conjunction with FIGS. 18-30C. Additional processing is contemplated by the present disclosure. Additional steps can be provided before, during, and after method 600, and some of the steps described can be moved, replaced, or eliminated for additional embodiments of method 600.

Figure 19:
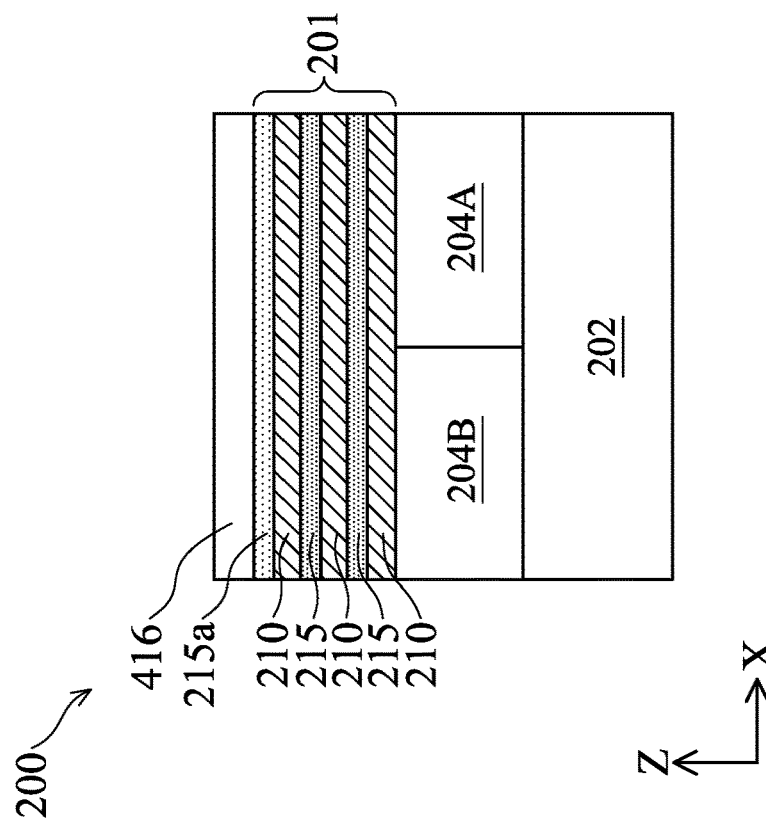
Figure 18:
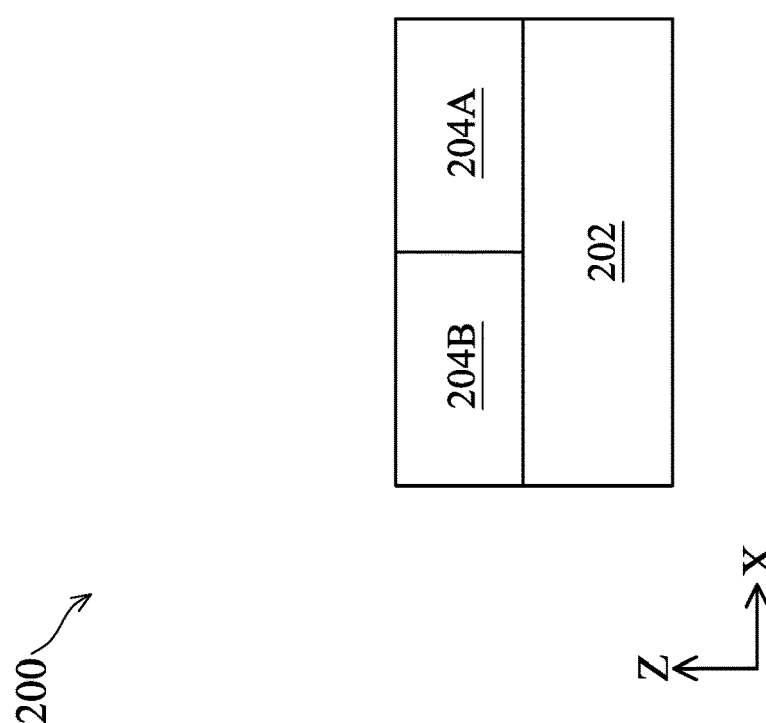

At operation 602, the method 600 (FIG. 17A) forms a semiconductor layer stack 201 over a substrate 202, where the semiconductor layer stack 201 includes semiconductor layers 210 and semiconductor layers 215 stacked vertically in an alternating or interleaving configuration from a surface of substrate 202. The substrate 202 is shown in FIG. 18 in an embodiment and includes the active regions 204A and 204B. The semiconductor layer stack 201 is shown in FIG. 19 in an embodiment. The topmost semiconductor layer 215 is labeled as 215a for convenience of discussion. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 210, a second one of semiconductor layers 210 is epitaxially grown on the first one of semiconductor layers 215, and so on until semiconductor layers stack 201 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

The semiconductor layers 215 or portions thereof form channel regions of the device 200. In the depicted embodiment, semiconductor layer stack 201 includes three semiconductor layers 210 and three semiconductor layers 215 configured to form three semiconductor layer pairs disposed over substrate 202, each semiconductor layer pair having a respective semiconductor layer 210 and a respective semiconductor layer 215. After undergoing subsequent processing, such configuration will result in the (GAA) device 200 having three channels. However, the present disclosure contemplates embodiments where semiconductor layer stack 201 includes more or less semiconductor layers, for example, depending on a number of channels desired for the device 200 (e.g., a GAA transistor) and/or design requirements of the device 200. For example, semiconductor layer stack 201 can include two to ten semiconductor layers 210 and two to ten semiconductor layers 215. In some embodiment, semiconductor layers 210 have a thickness about 1 nm to about 10 nm per layer and semiconductor layers 215 have a thickness about 1 nm to about 10 nm per layer, where the thicknesses are chosen based on fabrication and/or device performance considerations for the device 200. FIG. 19 also shows a hard mask layer 416 over the semiconductor layer stack 201 for protecting the semiconductor layer stack 201 during subsequent patterning process(es).

At operation 604, the method 600 (FIG. 17A) patterns the semiconductor layer stack 201 into fins 211 and the active regions 204A/B into fins 205A/B, such as shown in FIG. 20. The fins 211 and 205A/B may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the semiconductor layer stack 201 and is patterned using a photolithography process. Spacers are formed alongside the patterned sacrificial layer using a self-aligned process. The sacrificial layer is then removed, and the remaining spacers, or mandrels, may then be used as a masking element for patterning the fins. For example, the masking element may be used for etching recesses into the semiconductor layer stack 201 and the substrate 202, resulting in the fins 211, 205A, and 205B. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or BCl$_3$), a bromine-containing gas (e.g., HBr and/or CHBr$_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid (HNO$_3$), and/or acetic acid (CH$_3$COOH); or other suitable wet etchant. Numerous other embodiments of methods to form the fins may be suitable.

The operation 604 further forms the isolation features 230. The isolation features 230 can be formed by filling the trenches between the fins with an insulator material, for example, by using a CVD process or a spin-on glass process. A chemical mechanical polishing (CMP) process may be performed to remove excessive insulator material and/or planarize a top surface of isolation features 230. Then an etching back process is performed to recess the isolation features 230 to a desired thickness, such as surrounding a lower portion of the fins and leaving an upper portion of the fins (particularly, the fins 211) protruding above the isolation features 230. In an embodiment, the hard mask layer 416 is removed during the CMP process or the etching back process.

At operation 606, the method 600 (FIG. 17A) forms gate structures over the fins 211, wherein each gate structure includes a sacrificial gate stack 240' and the top gate spacers 247. The sacrificial gate stack 240' includes a sacrificial gate dielectric layer 246 and a sacrificial gate electrode layer 245. Referring to FIGS. 21A and 21B (FIG. 21A is a cross-sectional view of the device 200, in portion, along a widthwise direction of the fins 211, and FIG. 21B is a cross-sectional view of the device 200, in portion, along a lengthwise direction of the fins 211), the sacrificial gate dielectric layer 246 is formed on top and sidewalls of the fins 211 and the sacrificial gate electrode layer 245 is formed on the sacrificial gate dielectric layer 246. In embodiments, the sacrificial gate dielectric layer 246 may include a dielectric material, such as silicon oxide, silicon oxynitride, a high-k dielectric material, other suitable dielectric material, or combinations thereof and the sacrificial gate electrode layer 245 includes a suitable dummy gate material, such as polysilicon layer. The sacrificial gate electrode layer 245 and the sacrificial gate dielectric layer 246 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

Figures 22A, 22B, 22C:
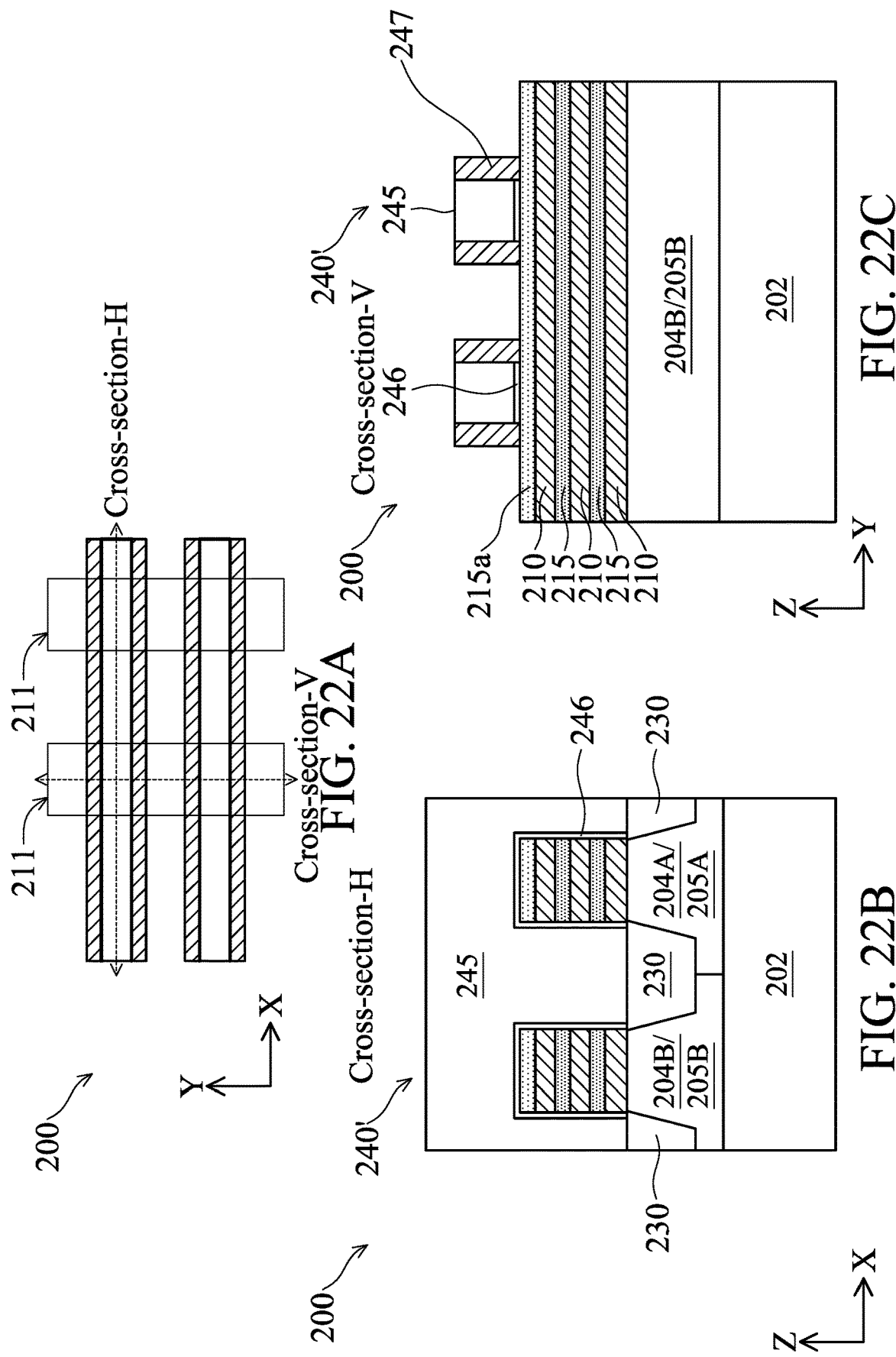

Referring to FIGS. 22A, 22B, and 22C, the operation 606 patterns the sacrificial gate electrode layer 245 and the sacrificial gate dielectric layer 246 into sacrificial gate stacks 240' that are oriented lengthwise perpendicular to the fins 211. FIG. 22A is a top view of the device 200, in portion, and FIGS. 22B and 22C are cross-sectional views of the device 200, in portion, along the "Cross-section-H" line and the "Cross-section-V" line of the FIG. 22A, respectively. For example, the operation 606 may perform lithography patterning and etching process to pattern the sacrificial gate electrode layer 245 and the sacrificial gate dielectric layer 246. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof. Then, the operation 606 forms the top spacers 247 on the sidewalls of the sacrificial gate stacks 240' by deposition and etching processes.

At operation 608, the method 600 (FIG. 17A) etches the fins 211 adjacent the top spacers 247 to form S/D trenches (or recesses) 250, such as shown in FIGS. 23A, 23B, and 23C. FIG. 23A is a top view of the device 200, in portion, and FIGS. 23B and 23C are cross-sectional views of the device 200, in portion, along the "Cross-section-H" line and the "Cross-section-V" line of the FIG. 23A, respectively. In the depicted embodiment, an etching process completely removes semiconductor layer stack 201 in source/drain regions of fins 211 thereby exposing the substrate portion 204A/B in the source/drain regions. In some embodiments, the etching process removes some, but not all, of semiconductor layer stack 201, such that source/drain trenches 250 have bottoms defined by semiconductor layer 210 or semiconductor layer 215 in source/drain regions. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of the gate stacks 240', the top spacers 247, and the isolation features 230.

The operation 608 also forms gaps 418 between the semiconductor layers 215. For example, an etching process is performed that selectively etches semiconductor layers 210 exposed by source/drain trenches 250 with minimal (to no) etching of semiconductor layers 215, such that gaps 418 are formed between semiconductor layers 215 and between semiconductor layers 215 and substrate 202 under the top spacers 247. The etching process may be a dry etching process, a wet etching process, other suitable etching process, or combinations thereof.

At operation 610, the method 600 (FIG. 17A) forms the inner spacers 255 in the gaps 418, epitaxially grows the S/D features 260A/B, and forms the ILD layer 270, such as shown in FIGS. 24A, 24B, and 24C. FIG. 24A is a top view of the device 200, in portion, and FIGS. 24B and 24C are cross-sectional views of the device 200, in portion, along the "Cross-section-H" line and the "Cross-section-V" line of the FIG. 24A, respectively. For example, a deposition process forms a spacer layer over gate structures 240' and over features defining source/drain trenches 250. The deposition process may be CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps 418. An etching process is then performed that selectively etches the spacer layer to form inner spacers 255 as depicted in FIG. 24C with minimal (to no) etching of semiconductor layers 215, dummy gate stacks 240', and gate spacers 247. In some embodiments, the spacer layer is removed from sidewalls of gate spacers 247, sidewalls of semiconductor layers 215, dummy gate stacks 240', and substrate 202. The spacer layer (and thus inner spacers 255) includes a material that is different than a material of semiconductor layers 215 and a material of gate spacers 247 to achieve desired etching selectivity during the second etching process. Then, the operation 610 forms the S/D features 260A and 260B using epitaxial growth processes. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202, the semiconductor fins 205A/B, and the semiconductor layers 215. The operation 610 may dope the S/D features 260A and 260B in-situ or ex-situ as discussed earlier. After the S/D features 260A and 260B are epitaxially grown, the operation 610 forms a CESL over the S/D features 260A and 260B and the gate structures 240' and forms the ILD layer 270 over the CESL.

The method 200 may proceed to an embodiment shown in FIG. 17B to cut the gate structures 240', form the gate-end dielectric features 404, and then form the high-k metal gates 240, or it may proceed to an embodiment shown in FIG. 17C to form the high-k metal gates 240, cut the high-k metal gates 240, and then form the gate-end dielectric features 404. These two embodiments are separately discussed below.

Referring to FIG. 17B, at operation 612, the method 600 cuts the gate structures 240' and forms the gate-end dielectric features 404, such as shown in FIGS. 25A, 25B, and 25C. FIG. 25A is a top view of the device 200, in portion, and FIGS. 25B and 25C are cross-sectional views of the device 200, in portion, along the "Cross-section-H" line and the "Cross-section-V" line of the FIG. 25A, respectively. For example, the operation 612 may form an etch mask using deposition and photolithography processes. The etch mask covers most part of the device 200 but exposes those areas vertically (along "y" direction) along the STD cell boundary (see FIG. 1 for example) through openings in the etch mask. In an embodiment, these openings are substantially rectangular patterns, making it easier for photolithography mask making and exposure. Then, the gate structure 240' and the gate spacers 247 are etched through these openings using one or more etching process. The etching process can include a dry etching process, a wet etching process, other suitable etching process, or combinations thereof. The etching process is tuned selective to the materials in the gate structures 240' (the sacrificial gate electrode 245) and with no (or minimal) etching to the isolation structure 230 and the ILD 270. The etching process completely removes the sacrificial gate electrode 245 exposed in the openings of the etch mask, thereby cutting the sacrificial gate electrode 245 into segments. The etching process may completely or partially remove the gate spacers 247 exposed in the openings of the etch mask, such as discussed with reference to FIGS. 6, 7, 15, and 16. The etching process results in trenches between the segments of the sacrificial gate electrode 245. Then, the operation 612 deposits one or more dielectric layers into the trenches and performs a CMP process to the one or more dielectric layers to form the gate-end dielectric features 404 as shown in FIG. 25B (as well as the gate-end dielectric features 404 as shown in FIGS. 5 and 6).

At operation 614, the method 600 (FIG. 17B) removes the gate structures 240' to form gate trenches 275, such as shown in FIGS. 26A, 26B, and 26C. FIG. 26A is a top view of the device 200, in portion, and FIGS. 26B and 26C are cross-sectional views of the device 200, in portion, along the "Cross-section-H" line and the "Cross-section-V" line of the FIG. 26A, respectively. For example, one or more etching processes completely removes the sacrificial gate structures 240' (including the sacrificial gate electrode 245 and the sacrificial gate dielectric layer 246) to expose semiconductor layers 215 and semiconductor layers 210 in channel regions. The etching process(es) may include a dry etching process, a wet etching process, other suitable etching process, or combinations thereof. In some embodiments, the etching processes are configured to selectively etch the sacrificial gate structures 240' with minimal (to no) etching of other features of the device 200, such as ILD layer 270, gate spacers 247, isolation features 230, semiconductor layers 215, and semiconductor layers 210.

Figure 27A:
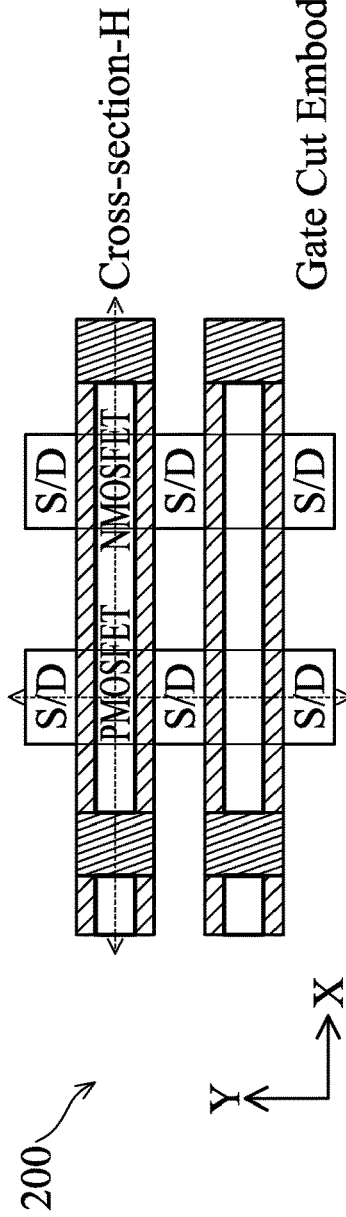
Figure 27B:
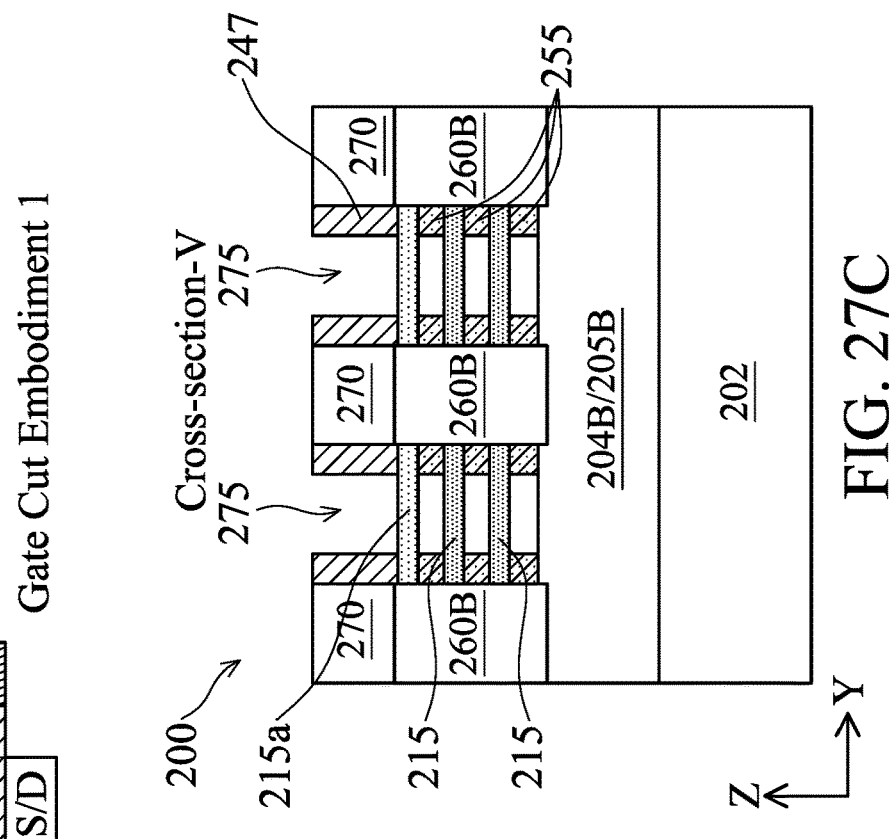
Figure 27C:
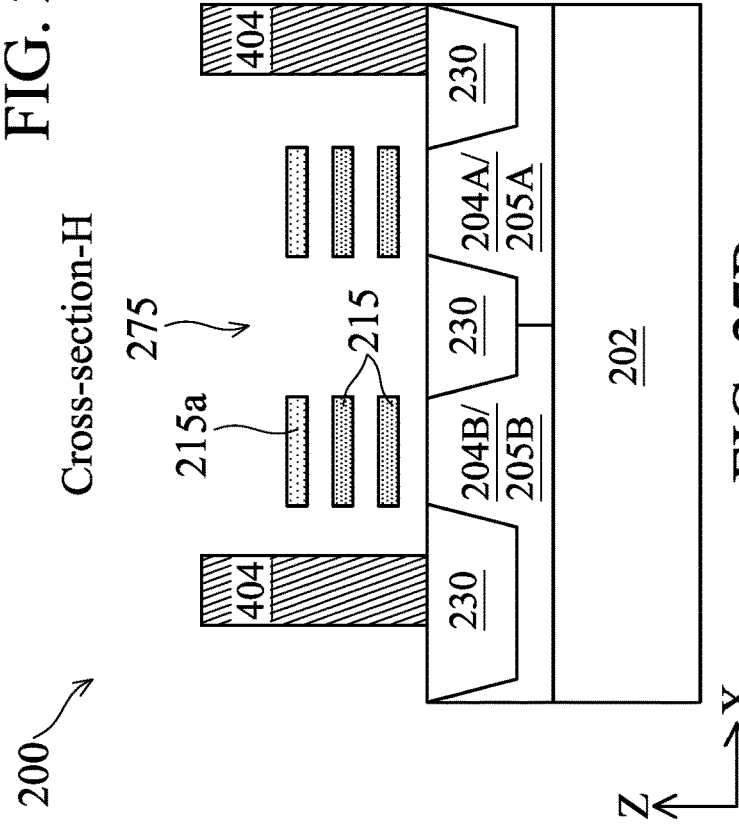

At operation 616, the method 600 (FIG. 17B) removes the semiconductor layers 210, such as shown in FIGS. 27A, 27B, and 27C. FIG. 27A is a top view of the device 200, in portion, and FIGS. 27B and 27C are cross-sectional views of the device 200, in portion, along the "Cross-section-H" line and the "Cross-section-V" line of the FIG. 27A, respectively. For example, an etching process selectively etches semiconductor layers 210 with minimal (to no) etching of semiconductor layers 215 and, in some embodiments, minimal (to no) etching of gate spacers 247 and/or inner spacers 255. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. The etching process may include a dry etching process, a wet etching process, other suitable etching process, or combinations thereof. As a result, the semiconductor layers 215 are suspended in the gate trenches 275. This process is also referred to as a channel release process.

At operation 618, the method 600 (FIG. 17B) forms the high-k metal gates 240 in the gate trenches 275, such as shown in FIGS. 28A, 28B, and 28C. FIG. 28A is a top view of the device 200, in portion, and FIGS. 28B and 28C are cross-sectional views of the device 200, in portion, along the "Cross-section-H" line and the "Cross-section-V" line of the FIG. 28A, respectively. For example, the operation 618 may form the gate dielectric layer 282 using chemical oxidation, thermal oxidation, atomic layer deposition (ALD), chemical vapor deposition (CVD), and/or other suitable methods, and may form the gate electrode 350 using ALD, CVD, PVD, plating, and/or other suitable processes.

At operation 620, the method 600 (FIG. 17B) performs further fabrication processes to the device 200, such as forming the gate top dielectric 408, forming S/D contacts 406, and so on. Particularly, as shown in FIGS. 28B and 28C, the gate top dielectric 408 are formed between the gate spacers 247 and between the gate-end dielectric features 404.

Figures 29A, 29B, 29C:
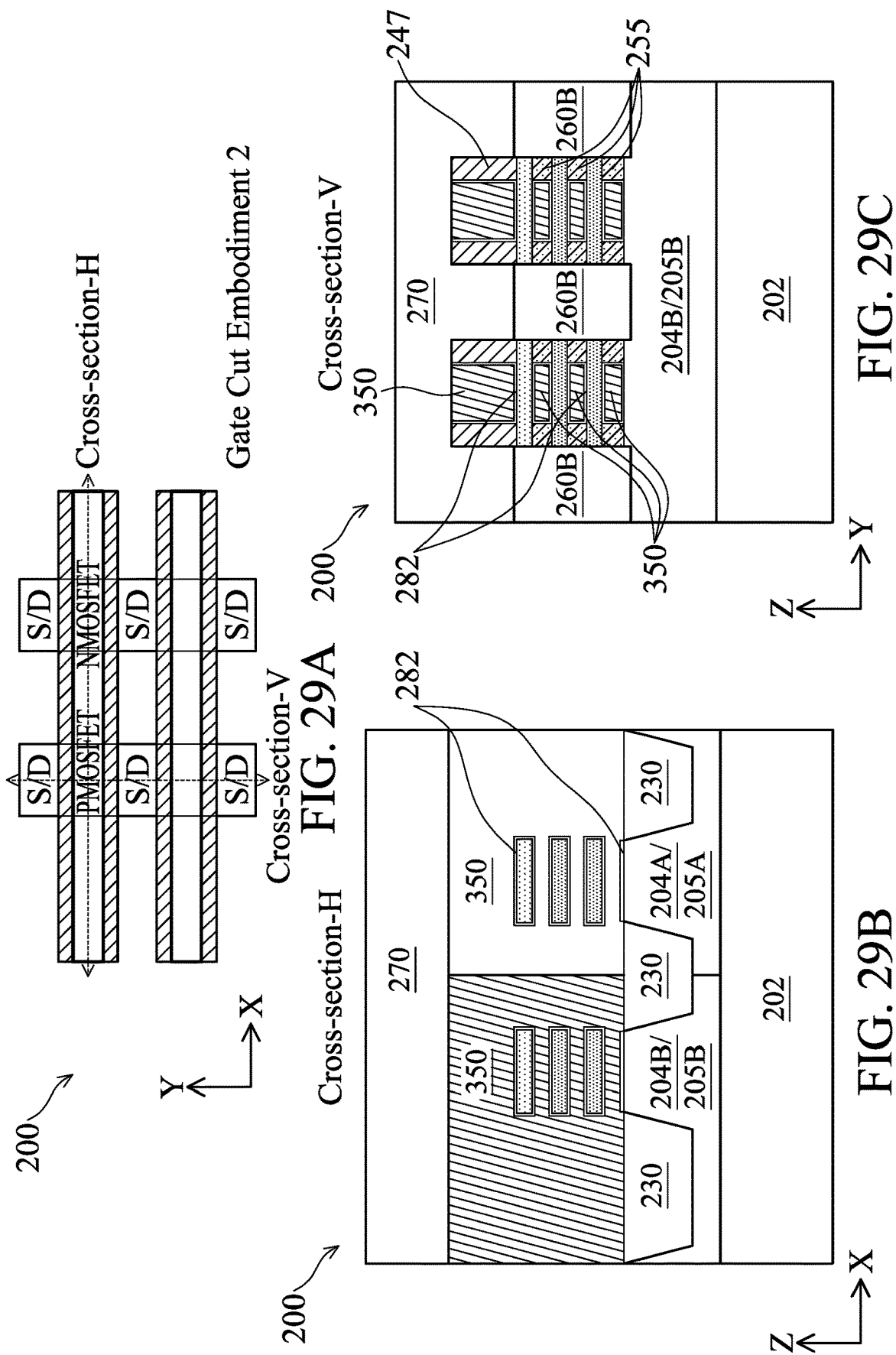

Referring to FIG. 17C, following the operation 610, the method 600 removes the sacrificial gate stacks 240' at operation 614 to form gate trenches, releases the channels at operation 616, and forms the high-k metal gate stacks 240 at operation 618. These three operations are similar to the operations 614, 616, and 618 in FIG. 17B. After the operation 618 completes, the device 200 is shown in FIGS. 29A, 29B, and 29C. FIG. 29A is a top view of the device 200, in portion, and FIGS. 29B and 29C are cross-sectional views of the device 200, in portion, along the "Cross-section-H" line and the "Cross-section-V" line of the FIG. 29A, respectively.

Then, the method 600 (FIG. 17C) proceeds to operation 619 to cut the gate stacks 240 and to form the gate-end dielectric features 404, such as shown in FIGS. 30A, 30B, and 30C. FIG. 30A is a top view of the device 200, in portion, and FIGS. 30B and 30C are cross-sectional views of the device 200, in portion, along the "Cross-section-H" line and the "Cross-section-V" line of the FIG. 30A, respectively. The operation 619 is similar to the operation 612 discussed above except that the cut process in the operation 619 applies to the high-k metal gates 240. After the gate-end dielectric features 404 are formed, the method 600 (FIG. 17C) proceeds to further fabrication processes to the device 200.

Figure 31:
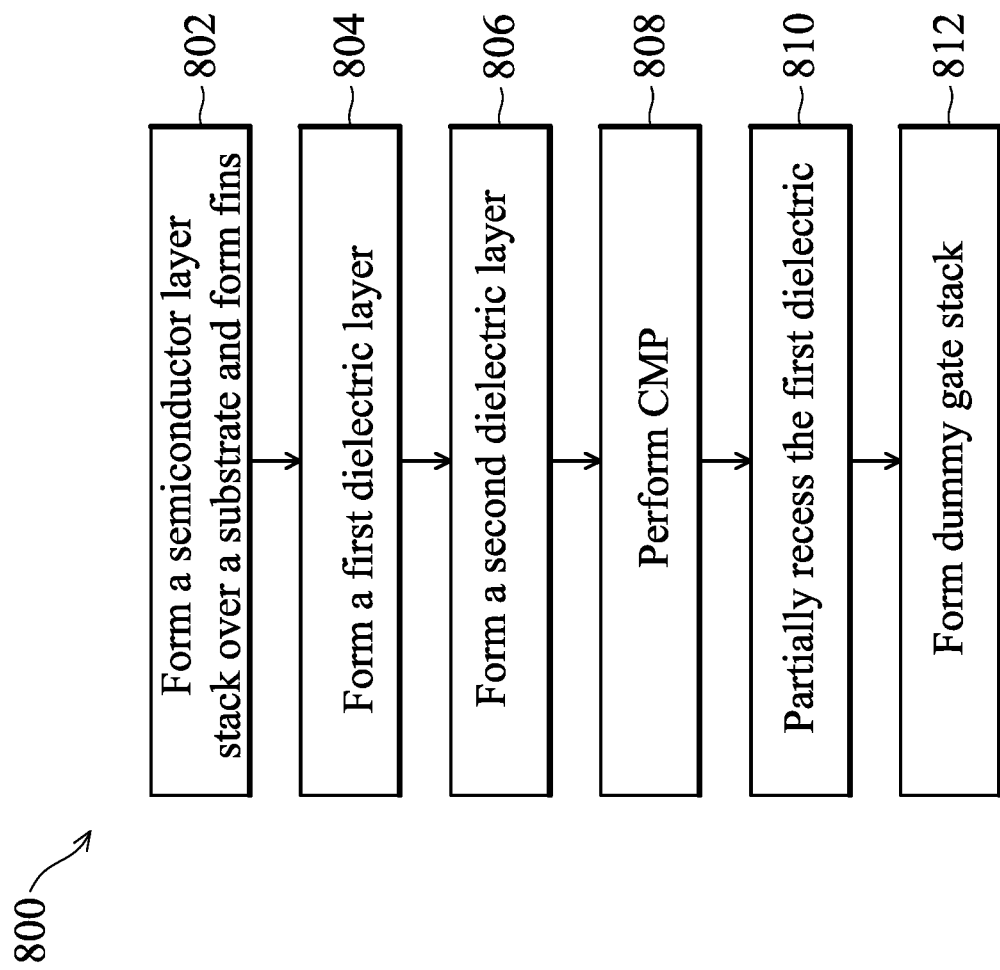
FIG. 31 is a flow chart of a method for fabricating a GAA device according to some embodiments of the present disclosure.

FIG. 31 is a flow chart of a method 800 for forming the dielectric lines 414, according to various aspects of the present disclosure. Method 800 is briefly described below in conjunction with FIGS. 32A through 32E-1. Additional processing is contemplated by the present disclosure. Additional steps can be provided before, during, and after method 800, and some of the steps described can be moved, replaced, or eliminated for additional embodiments of method 800.

Figure 32B:
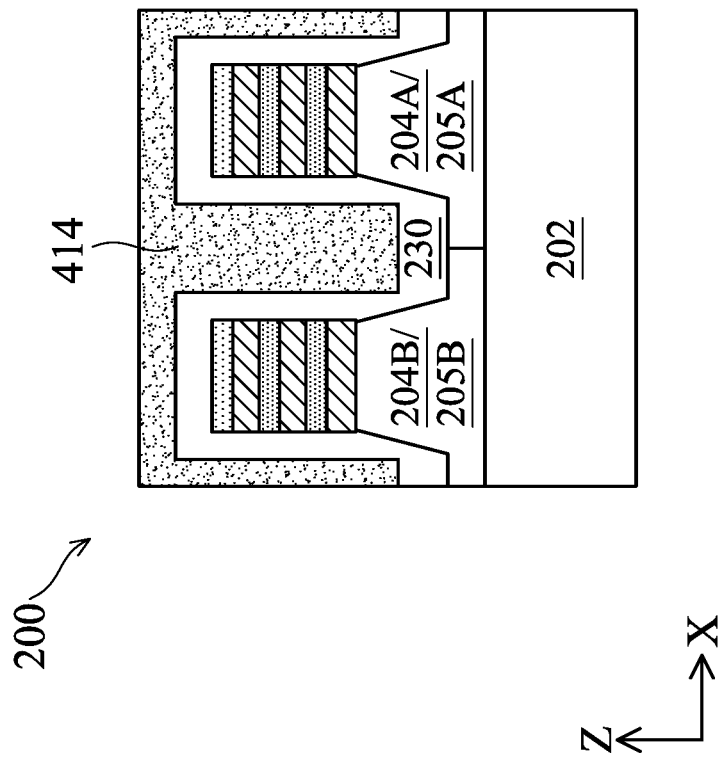
Figure 32A:
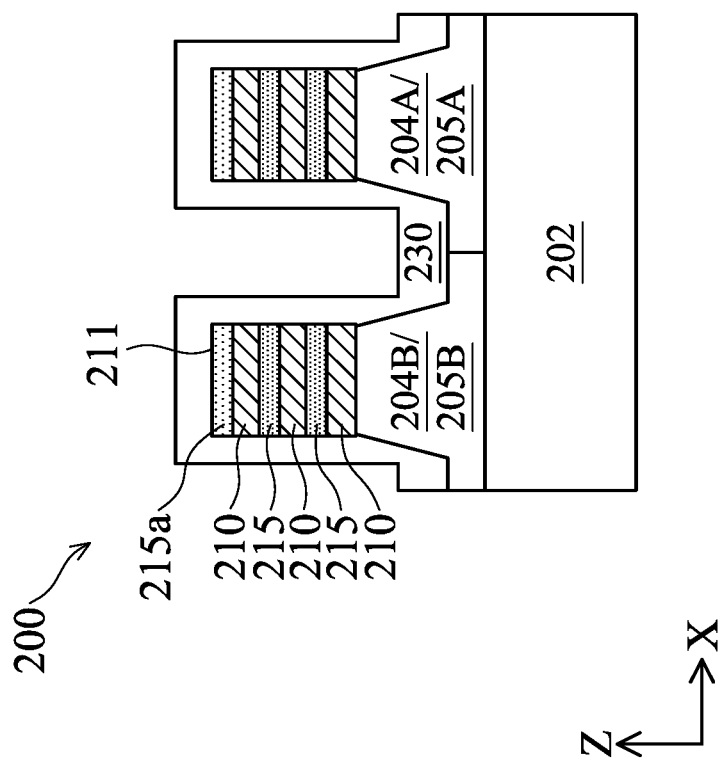
Figure 32D:
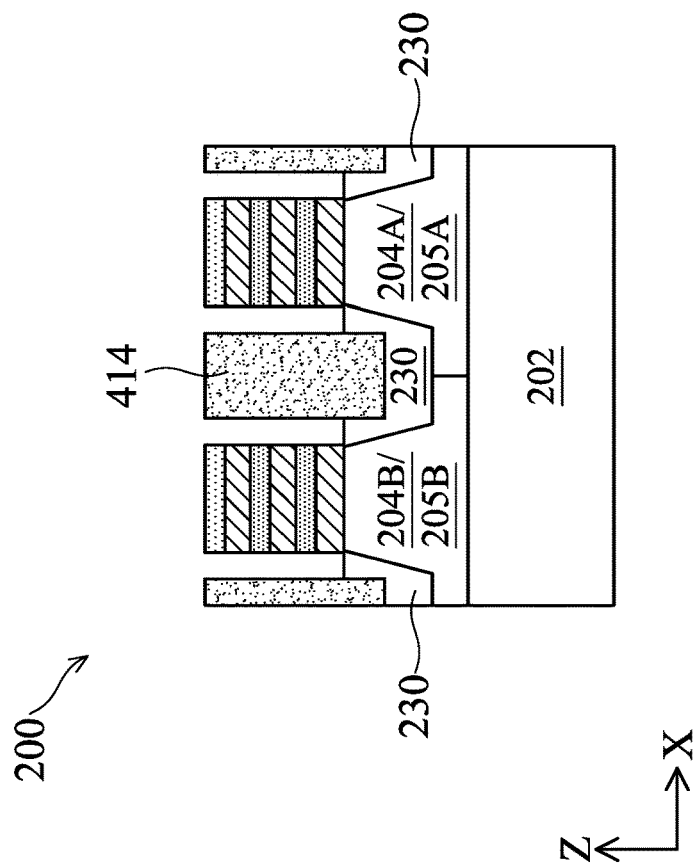

At operation 802, the method 800 (FIG. 31) Form a semiconductor layer stack 201 over a substrate 202 and form fins 211 from the semiconductor layer stack 201. This is similar to the operations 602 and 604 (FIG. 17A) discussed above. At operation 804, the method 800 (FIG. 31) forms a dielectric layer 230 over the fins 211, such as shown in FIG. 32A. The dielectric layer 230 may be deposited to a thickness about 5 nm to about 40 nm in some embodiments. The dielectric layer 230 does not fully fill the space between the fins 211. At operation 806, the method 800 (FIG. 31) forms a dielectric layer 414 over dielectric layer 230 and fully fills the space between the fins 211, such as shown in FIG. 32B.

Figure 32C:
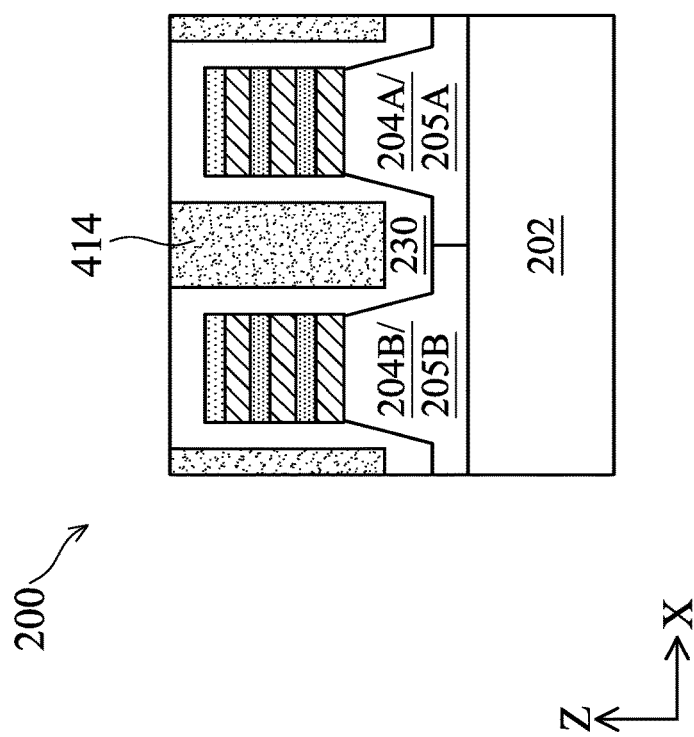

At operation 808, the method 800 (FIG. 31) performs a CMP process to the dielectric layer 414 and the dielectric layer 230, such as shown in FIG. 32C. This results in the dielectric lines 414. At operation 810, the method 800 (FIG. 31) recesses the dielectric layer 230 using an etch process that is selective to the materials of the dielectric layer 230 and with no (or minimal) etching to the semiconductor layer 215 and the dielectric lines 414. This results in the isolation features 230.

At operation 812, the method 800 (FIG. 31) forms the sacrificial gate stacks 240' (including the sacrificial gate dielectric layer 246 and the sacrificial gate electrode 245) over the dielectric lines 414, the dielectric layer 230, and the fins 211. In an embodiment, the sacrificial gate dielectric layer 246 is formed using an oxidation process by oxidizing the surfaces of the fins 211. In such embodiment, the sacrificial gate dielectric layer 246 is deposited over the fins 211, but not over the dielectric lines 414 and the dielectric layer 230, such as shown in FIG. 32E. In another embodiment, the sacrificial gate dielectric layer 246 is formed using a deposition process such as ALD. In such embodiment, the sacrificial gate dielectric layer 246 is deposited over the fins 211, the dielectric lines 414, and the dielectric layer 230, such as shown in FIG. 32E-1. The method 800 may proceed to other operations, such as cutting the sacrificial gate stacks 240' or replacing the sacrificial gate stacks 240' with high-k metal gate stacks 240 as discussed above.

Although not intended to be limiting, one or more embodiments of the present disclosure provide many benefits to a semiconductor device and the formation thereof. For example, embodiments of the present disclosure provide highly reliable gate-end dielectric scheme between the gate-end and gate-end as well as multiple spacer scheme for gate sidewalls to reduce stray capacitance and to increase gate isolation. The present embodiments can be readily integrated into existing CMOS fabrication processes.

In one example aspect, the present disclosure is directed to a semiconductor structure that includes a substrate, an isolation structure over the substrate, a semiconductor fin extending from the substrate and adjacent to the isolation structure, two source/drain (S/D) features over the semiconductor fin, a stack of channel layers suspended over the semiconductor fin and connecting the S/D features, a gate structure wrapping around each of the channel layers in the stack of channel layers, two outer spacers disposed on two opposing sidewalls of the gate structure, inner spacers disposed between the S/D features and the channel layers, and a gate-end dielectric feature over the isolation structure and directly contacting an end of the gate structure. A material included in the gate-end dielectric feature has a higher dielectric constant than materials included in the outer spacers and the inner spacers.

In an embodiment of the semiconductor structure, the material included in the inner spacers has a higher dielectric constant than the material included in the outer spacers. In an embodiment, portions of the two outer spacers are also disposed below the gate-end dielectric feature and above the isolation structure. In another embodiment, the gate-end dielectric feature includes a high-k dielectric material.

In an embodiment, the semiconductor structure further includes a dielectric fin disposed over the isolation structure and oriented lengthwise parallel to the semiconductor fin, wherein the dielectric fin directly contacts a lower portion of the end of the gate structure, the gate-end dielectric feature is disposed over the dielectric fin and directly contacts an upper portion of the end of the gate structure.

In another embodiment, the semiconductor structure further includes a gate-top dielectric layer disposed over the gate structure. In some embodiments where the gate structure is a first high-k metal gate structure, the semiconductor structure further includes a second high-k metal gate structure that is lengthwise aligned with the first high-k metal gate structure, wherein the gate-end dielectric feature is disposed in contact with an end of the second high-k metal gate structure.

In some embodiments where the gate structure is a high-k metal gate structure, the semiconductor structure further includes a dielectric gate structure that is lengthwise aligned with the high-k metal gate structure, wherein the gate-end dielectric feature is disposed in contact with an end of the dielectric gate structure.

In some embodiments where the gate structure is a first gate structure and the two outer spacers are two first outer spacers, the semiconductor structure further includes a second gate structure that is lengthwise parallel with the first gate structure; two second outer spacers disposed on two opposing sidewalls of the second gate structure; and an S/D contact disposed over one of the two S/D features, wherein the S/D contact physically contacts a sidewall of one of the first outer spacers and a sidewall of one of the second outer spacers.

In another example aspect, the present disclosure is directed to a semiconductor structure that includes a substrate; an isolation structure over the substrate; a semiconductor fin extending from the substrate and adjacent to the isolation structure; first and second dielectric fins disposed over the isolation structure and oriented lengthwise parallel to the semiconductor fin, wherein the semiconductor fin is between the first and the second dielectric fins; two source/drain (S/D) features grown on the semiconductor fin; a stack of channel layers suspended over the semiconductor fin and connecting the two S/D features; a gate structure wrapping around each of the channel layers in the stack of channel layers, wherein the gate structure is also disposed over the first dielectric fin; two outer spacers disposed on two opposing sidewalls of the gate structure; inner spacers disposed between the S/D features and the channel layers; and a gate-end dielectric feature disposed over the second dielectric fin and directly contacting an end of the gate structure, wherein the gate-end dielectric feature, the outer spacers, and the inner spacers include different materials.

In some embodiments, a material included in the gate-end dielectric feature has a higher dielectric constant than materials included in the outer spacers and the inner spacers. In some embodiments, the second dielectric fin directly contacts a lower portion of the end of the gate structure, and the gate-end dielectric feature directly contacts an upper portion of the end of the gate structure.

In some embodiments, top surfaces of the first and the second dielectric fins are above a top surface of the S/D features. In some embodiments, portions of the outer spacers are disposed above the second dielectric fin and below the gate-end dielectric feature.

In an embodiment, the semiconductor structure further includes an S/D contact disposed on one of the S/D features. The S/D contact is oriented lengthwise parallel to the gate structure, and a portion of the S/D contact is disposed over the second dielectric fin and contacts the gate-end dielectric feature.

In yet another example aspect, the present disclosure is directed to a method that includes providing a structure having a substrate, an isolation structure over the substrate, a semiconductor fin extending from the substrate and adjacent to the isolation structure, a dummy gate over the isolation structure and engaging a channel region of the semiconductor fin, and outer spacers on two opposing sidewalls of the dummy gate, wherein the semiconductor fin includes a stack of first semiconductor layers and second semiconductor layers alternatingly stacked. The method further includes etching the semiconductor fin proximate the two opposing sidewalls of the dummy gate to form two source/drain (S/D) trenches; etching the second semiconductor layers from the S/D trenches to form gaps vertically between the first semiconductor layers; forming inner spacers in the gaps; epitaxially growing S/D features in the S/D trenches; forming an inter-layer dielectric (ILD) layer over the S/D features, the dummy gate, and the outer spacers; etching the dummy gate and the outer spacers to form a gate-end trench that is away from the semiconductor fin and over the isolation structure; and forming a gate-end dielectric feature filling the gate-end trench, wherein a dielectric constant of the gate-end dielectric feature is higher than both a dielectric constant of the outer spacers and a dielectric constant of the inner spacers.

In an embodiment of the method, the structure further includes a dielectric fin disposed over the isolation structure and oriented lengthwise parallel to the semiconductor fin, wherein the gate-end trench exposes a top surface of the dielectric fin. In some embodiments of the method, portions of the outer spacers remain in the gate-end trench from a top view. In some embodiments of the method, the gate-end dielectric feature includes a material whose dielectric constant is greater than 3.9.

In an embodiment, the method further includes removing remaining portions of the dummy gate after the forming of the gate-end dielectric feature, thereby forming a gate trench; removing the second semiconductor layers from the gate trench, leaving the first semiconductor layers suspended over the substrate and connected between the S/D features; and forming a high-k metal gate in the gate trench, wherein portions of the high-k metal gate wrap around each of the first semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a substrate, an isolation structure over the substrate, a semiconductor fin extending from the substrate and adjacent to the isolation structure, a first dielectric fin and a second dielectric fin adjacent to two opposing sides of the semiconductor fin, a dummy gate over the isolation structure and engaging a channel region of the semiconductor fin, and outer spacers on two opposing sidewalls of the dummy gate, wherein the semiconductor fin includes a stack of first semiconductor layers and second semiconductor layers alternatingly stacked, and wherein a height of the first dielectric fin is less than a height of the second dielectric fin;
etching the semiconductor fin proximate the two opposing sidewalls of the dummy gate to form two source/drain (S/D) trenches;
etching the second semiconductor layers from the S/D trenches to form gaps vertically between the first semiconductor layers;
forming inner spacers in the gaps;
epitaxially growing S/D features in the S/D trenches;
forming an inter-layer dielectric (ILD) layer over the S/D features, the dummy gate, and the outer spacers;
etching the dummy gate and the outer spacers to form a gate-end trench that is away from the semiconductor fin and over the isolation structure, the gate-end trench exposing the first dielectric fin; and
forming a gate-end dielectric feature filling the gate-end trench, wherein a dielectric constant of the gate-end dielectric feature is higher than both a dielectric constant of the outer spacers and a dielectric constant of the inner spacers.

2. The method of claim 1, wherein the first dielectric fin extends into the isolation structure and oriented lengthwise parallel to the semiconductor fin.

3. The method of claim 1, wherein portions of the outer spacers remain in the gate-end trench from a top view.

4. The method of claim 1, wherein the gate-end dielectric feature includes a material whose dielectric constant is greater than 3.9.

5. The method of claim 1, further comprising:
removing remaining portions of the dummy gate after the forming of the gate-end dielectric feature, thereby forming a gate trench;
removing the second semiconductor layers from the gate trench, leaving the first semiconductor layers suspended over the substrate and connected between the S/D features; and
forming a high-k metal gate in the gate trench, wherein portions of the high-k metal gate wrap around each of the first semiconductor layers.

6. The method of claim 5, wherein the gate-end dielectric feature directly contacts the high-k metal gate.

7. The method of claim 5, wherein the first dielectric fin directly contacts a lower portion of the high-k metal gate.

8. The method of claim 7, wherein a top surface of the first dielectric fin is below a bottom surface of a topmost layer of the first semiconductor layers.

9. The method of claim 1, wherein the etching of the dummy gate and the outer spacers completely etches the dummy gate and partially etches the outer spacers, wherein the forming of the gate-end dielectric feature includes forming a portion of the gate-end dielectric feature directly on a portion of the outer spacers.

10. A method, comprising:
providing a structure having a substrate, an isolation structure over the substrate, a semiconductor fin protruding from the substrate and higher than the isolation structure, a dummy gate over the isolation structure and engaging a channel region of the semiconductor fin, outer spacers on two opposing sidewalls of the dummy gate, and a dielectric fin over the isolation structure and oriented lengthwise parallel to the semiconductor fin, wherein the semiconductor fin includes a stack of first semiconductor layers and second semiconductor layers alternatingly stacked, and a top surface of the dielectric fin is below a bottom surface of a topmost layer of the first semiconductor layers;
etching the semiconductor fin proximate the two opposing sidewalls of the dummy gate to form two source/drain (S/D) trenches;
etching the second semiconductor layers from the S/D trenches to form gaps vertically between the first semiconductor layers;
forming inner spacers in the gaps;
epitaxially growing S/D features in the S/D trenches;
etching the dummy gate and the outer spacers to form a gate-end trench that is away from the semiconductor fin; and
filling a first dielectric material into the gate-end trench, wherein the first dielectric material, the outer spacers, and the inner spacers include different materials, and a dielectric constant of the first dielectric material is higher than both a dielectric constant of the outer spacers and a dielectric constant of the inner spacers.

11. The method of claim 10, wherein the gate-end trench exposes a portion of the dielectric fin.

12. The method of claim 11, wherein a portion of the first dielectric material is disposed directly on the portion of the dielectric fin.

13. The method of claim 12, wherein the portion of the first dielectric material is sandwiched on two sides by the outer spacers.

14. The method of claim 10, further comprising:
performing a chemical mechanical planarization process to the first dielectric material after the filling of the gate-end trench with the first dielectric material; and
replacing remaining portions of the dummy gate with high-k metal gates.

15. A method, comprising:
receiving an intermediate structure comprising a fin-shaped structure over a substrate, an isolation feature adjacent to a lower portion of the fin-shaped structure, and a first dielectric fin and a second dielectric fin adjacent to two opposing sides of an upper portion of the fin-shaped structure, the fin-shaped structure comprising a stack of alternating channel layers and sacrificial layers, and a height of the second dielectric fin being greater than a height of the first dielectric fin;
forming a dummy gate structure over a channel region of the fin-shaped structure;
forming a gate spacer extending along a sidewall surface of the dummy gate structure;
recessing portions of the fin-shaped structure not covered by the dummy gate structure to form source/drain recesses exposing sidewall surfaces of the channel region;
selectively recessing the sacrificial layers to form inner spacer recesses;
forming inner spacer features in the inner spacer recesses;
forming source/drain features in the source/drain recesses;
forming a dielectric feature extending into the dummy gate structure and disposed adjacent to the channel region of the fin-shaped structure, wherein the dielectric feature is disposed over and in direct contact with the first dielectric fin, and wherein a dielectric constant of the dielectric feature is greater than a dielectric constant of the gate spacer and a dielectric constant of the inner spacer features, and a top surface of the dielectric feature is no lower than a top surface of the dummy gate structure;
selectively removing the dummy gate structure and the sacrificial layers without substantially etching the dielectric feature to form gate trenches; and
forming a functional gate structure in the gate trenches, wherein the functional gate structure extends over the second dielectric fin.

16. The method of claim 15, wherein the first dielectric fin is oriented lengthwise parallel to the fin-shaped structure.

17. The method of claim 15, wherein a top surface of the functional gate structure is below a top surface of the dielectric feature.

18. The method of claim 15, wherein a bottom surface of the dielectric feature is above a top surface of the isolation feature.

19. The method of claim 15, wherein the fin-shaped structure is a first fin-shaped structure, the source/drain features are first source/drain features and comprise dopants having a first doping polarity, and the method further comprises:
forming a second fin-shaped structure over the substrate and adjacent to the first fin-shaped structure; and
forming second source/drain features coupled to channel layers of the second fin-shaped structure, the second source/drain features comprising dopants having a second doping polarity different than the first doping polarity,
wherein the functional gate structure extends over and wraps around channel layers of the first fin-shaped structure and channel layers of the second fin-shaped structures.

20. The method of claim 15, further comprising:
forming a source/drain contact over and electrically coupled to one of the source/drain features,
wherein, in a cross-sectional view, the source/drain contact is in direct contact with the dielectric feature and the first dielectric fin.

* * * * *